United States Patent
Zhang et al.

(10) Patent No.: US 10,396,232 B2
(45) Date of Patent: Aug. 27, 2019

(54) CDTE-BASED DOUBLE HETEROSTRUCTURES AND RELATED LIGHT-CONVERSION DEVICES

(71) Applicant: ARIZONA BOARD OF REGENTS ON BEHALF OF ARIZONA STATE UNIVERSITY, Scottsdale, AZ (US)

(72) Inventors: Yong-Hang Zhang, Scottsdale, AZ (US); Mathieu Boccard, Tempe, AZ (US); Zachary Holman, Phoenix, AZ (US); Yuan Zhao, Mesa, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 16/090,033

(22) PCT Filed: Mar. 29, 2017

(86) PCT No.: PCT/US2017/024814
§ 371 (c)(1),
(2) Date: Sep. 28, 2018

(87) PCT Pub. No.: WO2017/172962
PCT Pub. Date: Oct. 5, 2017

(65) Prior Publication Data
US 2019/0109252 A1 Apr. 11, 2019

Related U.S. Application Data

(60) Provisional application No. 62/315,963, filed on Mar. 31, 2016.

(51) Int. Cl.
*H01L 31/073* (2012.01)
*H01L 31/0296* (2006.01)
(Continued)

(52) U.S. Cl.
CPC ...... *H01L 31/073* (2013.01); *H01L 31/02966* (2013.01); *H01L 31/022475* (2013.01);
(Continued)

(58) Field of Classification Search
CPC ............. H01L 31/02966; H01L 31/072; H01L 31/073; H01L 31/0445; H01L 31/022475; H01L 31/1836
See application file for complete search history.

(56) References Cited

PUBLICATIONS

Datta, A. et al., "Computer Modeling of Heterojunction with Intrinsic Thin Layer "HIT" Solar Cells" Sensitivity Issues and Insights Gained, Intech., Nov. 11, 2011.
(Continued)

*Primary Examiner* — Golam Mowla
(74) *Attorney, Agent, or Firm* — Yakov S. Sidorin; Quarles & Brady LLP

(57) ABSTRACT

Devices converting light to electricity (such as solar cells or photodetectors) including a heavily-doped p-type a-SiC$_y$:H and an i-Mg$_x$Cd$_{1-x}$Te/n-CdTe/N—Mg$_{0.24}$Cd$_{0.76}$Te double heterostructure (DH), with power conversion efficiency of as high as 17%, V$_{oc}$ as high as 1.096 V, and all operational characteristics being substantially better than those of monocrystalline solar cells known to-date. The a-SiC$_y$:H layer is configured to enable high built-in potential while, at the same time, allowing the doped absorber to maintain a very long carry lifetime. In comparison, similar undoped CdTe/Mg$_x$Cd$_{1-x}$Te DH designs reveal a long carrier lifetime of 3.6 µs and an interface recommendation velocity of 1.2 cm/s, which are lower than the record values reported for GaAs/Al$_{0.5}$Ga$_{0.5}$As (18 cm/s) and GaAs/Ga$_{0.5}$In$_{0.5}$P (1.5 cm/s) DHs.

20 Claims, 28 Drawing Sheets

(51) Int. Cl.
    *H01L 31/072*     (2012.01)
    *H01L 31/18*     (2006.01)
    *H01L 31/0445*     (2014.01)
    *H01L 31/0224*     (2006.01)

(52) U.S. Cl.
    CPC ........ *H01L 31/0445* (2014.12); *H01L 31/072* (2013.01); *H01L 31/1836* (2013.01); *Y02E 10/543* (2013.01)

(56) References Cited

PUBLICATIONS

Liu, S., "Towards High-Efficiency Thin-Film Solar Cells: From Theoretical Analysis to Experimental Exploration," Dissertation Presented in Partial Fulfillment of the Requirements for the Degree of Doctor of Philosophy, Aug. 2015, 148 pages.

Liu, S., et al., "Carrier Lifetimes and Interface Recombination Velocities in CdTe/MgxCd1Te Double Heterostructures with Different Mg Compositions Grown by Molecular Beam Epitaxy," Applied Physics Letter 107 (2015).

Dinezza, J. D., "Monocrystalline ZnTe/CdTe/MgCdTe Double Heterostructure Solar Cells Grown on InSb Substrates by Molecular Beam Epitaxy", Dissertation, Arizona State University, Dec. 2014.

Dinezza, J. D., et al., "Growth, steady-state, and time-resolved photoluminescence study of CdTe/MgCdTe double heterostructures on InSb substrates using molecular beam epitaxy", Applied Physics Letters 103, 193901, vol. 103, Issue 19, Nov. 2013.

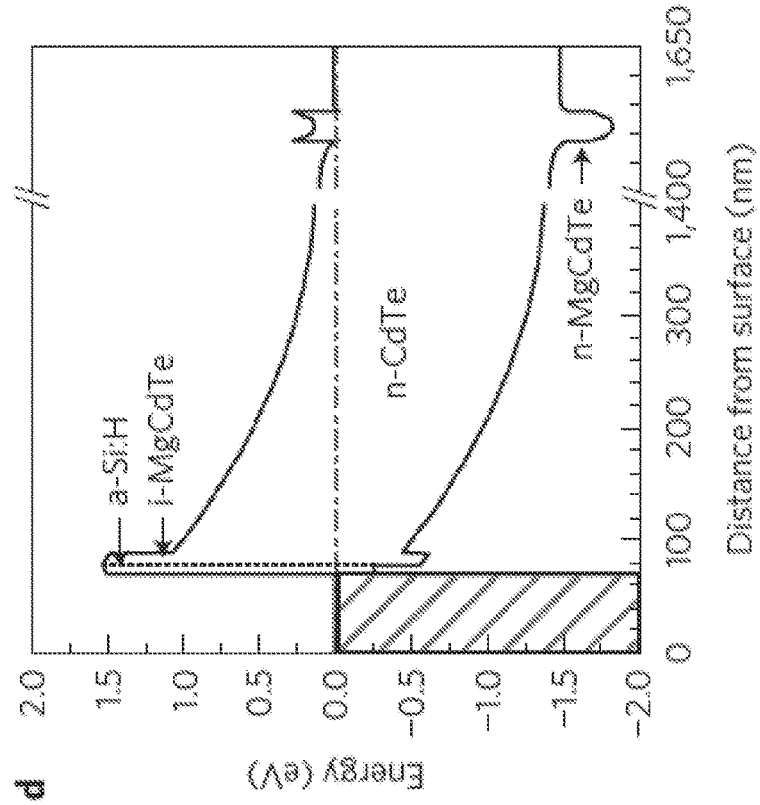
FIG. 10B
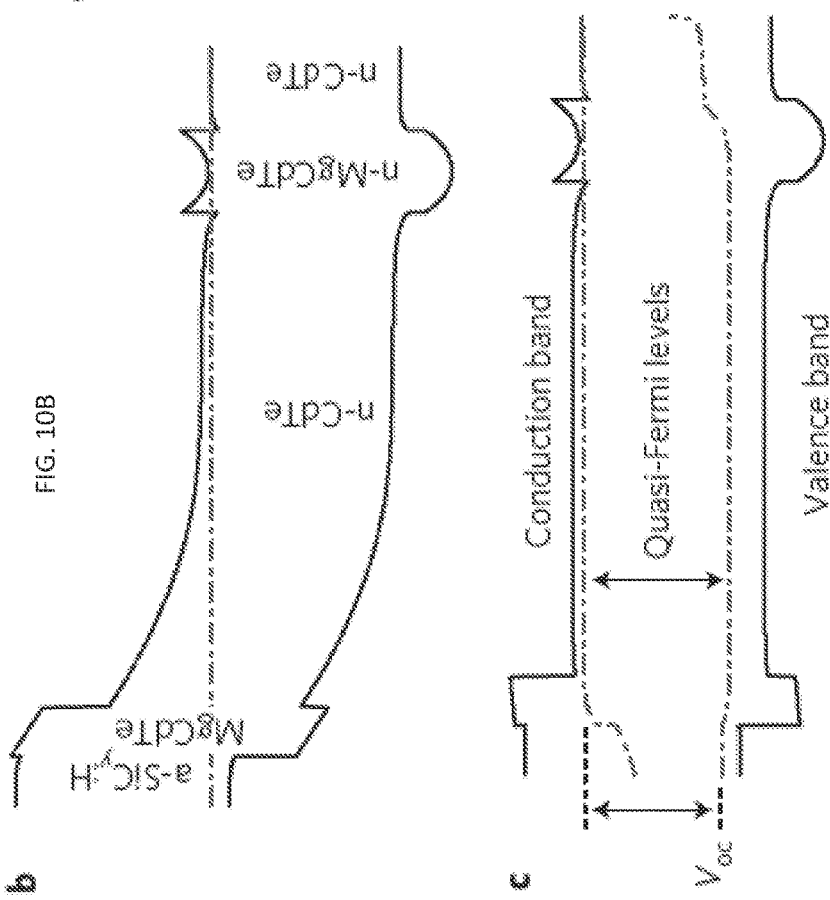
FIG. 10C
FIG. 10D

|  | ITO | a-Si:H | i-MgCdTe | n-CdTe | n-MgCdTe |
|---|---|---|---|---|---|
| Bandgap | 4 eV | 1.8 eV | 2.095 eV | 1.51 eV | 1.98 eV |
| Electron Affinity | 4.9 eV | 3.9 eV | 3.871 eV | 4.28 eV | 3.951 eV |
| Doping | n-type | p-type | Intrinsic | n-type | n-type |
| Doping Density | Degenerate | $1 \times 10^{18}$ cm$^{-3}$ | NA | $1 \times 10^{16}$ cm$^{-3}$ | $5 \times 10^{17}$ cm$^{-3}$ |
| Intrinsic Carrier Conc. | Metal Like | $8 \times 10^{4}$ cm$^{-3}$ | $6 \times 10^{3}$ cm$^{-3}$ | $5 \times 10^{5}$ cm$^{-3}$ | $6 \times 10^{3}$ cm$^{-3}$ |
| $N_c/N_v$ | Metal Like | 1 | 0.144 | 0.144 | 0.144 |
| Thickness | 70 nm | 8 nm | 10 nm | 1 um | 50 nm |

FIG. 11

PARAMETERS USED FOR BAND-EDGE DIAGRAM SIMULATIONS

| | p-ZnTe | i-MgCdTe | n-CdTe | n-MgCdTe |
|---|---|---|---|---|
| Bandgap | 2.27 eV | 2.095 eV | 1.5 eV | 1.98 eV |
| Mg Composition | - | 0.40 | - | 0.26 |
| Electron Affinity | 3.616 eV | 3.871 eV | 4.28 eV | 3.951 eV |
| Doping Density | $2 \times 10^{18}$ cm$^{-3}$ | 0 cm$^{-3}$ | $1 \times 10^{16}$ cm$^{-3}$ | $5 \times 10^{17}$ cm$^{-3}$ |
| Intrinsic Carrier Conc. | $3 \times 10^{-1}$ cm$^{-3}$ | $6 \times 10^{3}$ cm$^{-3}$ | $5 \times 10^{5}$ cm$^{-3}$ | $6 \times 10^{3}$ cm$^{-3}$ |
| $N_C/N_V$ | 0.073 | 0.144 | 0.144 | 0.144 |
| Thickness | 20 nm | 10 nm | 1000 nm | 50 nm |

FIG. 17

MAXIMUM OPEN-CIRCUIT VOLTAGE AND POWER CONVERSION EFFICIENCY FOR VARIOUS DESIGNS

| | ZnTe:As/ CdTe | ZnTe:Cu/ MgCdTe/CdTe | ZnTe:As/ MgCdTe/CdTe | a-Si:H/ MgCdTe/CdTe |
|---|---|---|---|---|
| $J_{sc}$ (mA/cm$^2$) | 21.2 | 22.2 | 23.6 | 22.3 |
| $V_{oc}$ (V) | 0.759 | 0.819 | 0.860 | 1.04 |
| FF (%) | 67.4 | 51.7 | 69.4 | 73.6 |
| $\eta$ (%) | 10.9 | 9.4 | 14.1 | 17.0 [4] |

FIG. 25

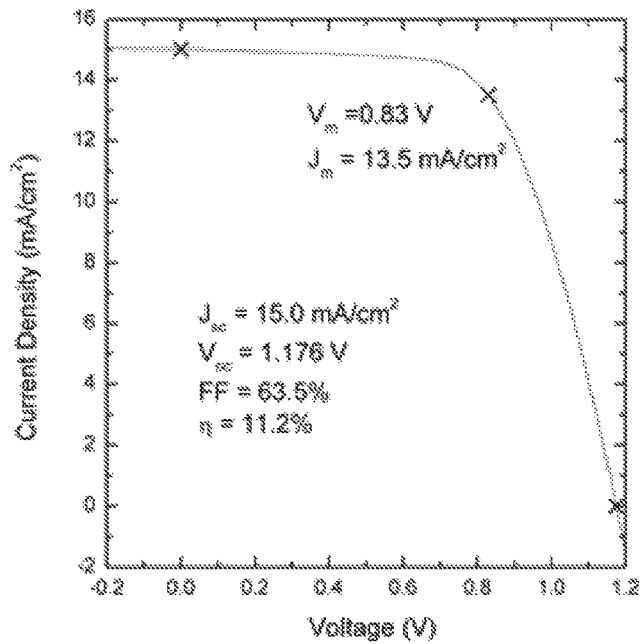
FIG. 30A
FIG. 30B
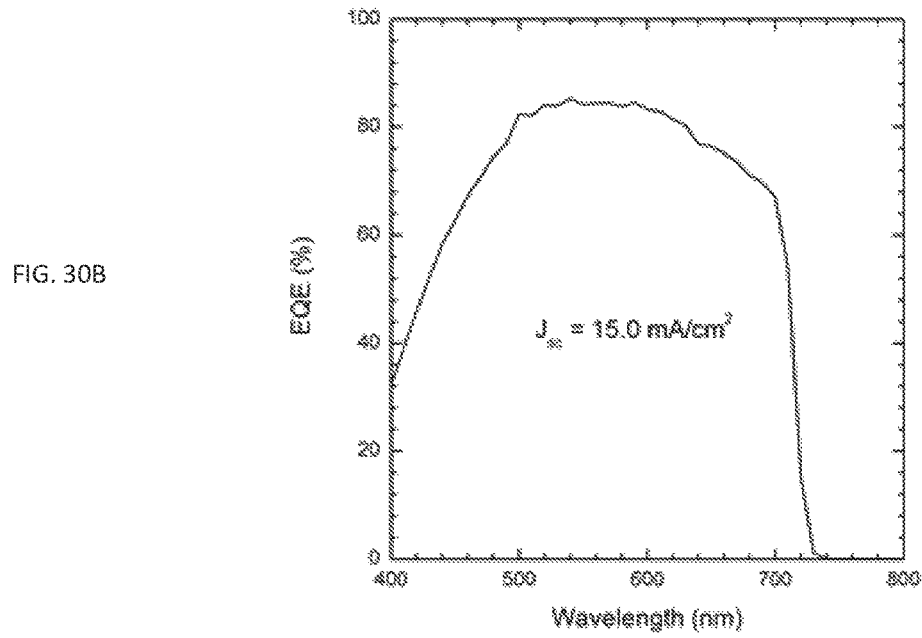

CDTE-BASED DOUBLE HETEROSTRUCTURES AND RELATED LIGHT-CONVERSION DEVICES

CROSS-REFERENCE TO RELATED APPLICATIONS

The present application represents the U.S. National Stage entry of PCT/US2017/024814, filed on Mar. 29, 2017, and claims priority from and benefit of the U.S. Provisional Patent Application No. 62/315,963, titled "Heterostructure Solar Cells and Photodetectors based on CdTe" and filed on Mar. 31, 2016. The disclosure of each of the above-identified patent applications is incorporated herein by reference.

TECHNICAL FIELD

This invention relates generally to devices configured to convert light into electrical energy and, in particular, to solar cells and photodetectors utilizing novel CdTe-based heterostructures.

BACKGROUND

Efficient photon-to-electron conversion is a desirable material property for photovoltaic applications. The photon-to-electron conversion efficiency needs to be unity (purely radiative recombination) for solar cells to achieve the Shockley-Qucisser limit. CdTe possesses the preferable optical properties for photovoltaic (PV) applications: a near optimum bandgap of 1.5 eV, and a high absorption coefficient of over 15,000 cm$^{-1}$ at the band edge.

CdTe thin-film solar cell technology is considered to be quite promising because polycrystalline CdTe possesses a close-to-optimum bandgap of 1.45 eV and a high absorption coefficient of over 15,000 cm$^{-1}$ at the band edge. The detailed-balance limit efficiency is about 32% with an open-circuit voltage ($V_{oc}$) of 1.17 V in the presence of the AM1.5G radiation. Power-conversion efficiency for a CdTe solar cell of about 22% (and module efficiency of about 19%) were demonstrated in the laboratory, which at least equals to or even surpasses multi-crystalline silicon module efficiency (18.5%). And yet, these efficiency values are still below both the Shockley-Queisser limit and the record efficiencies demonstrated by single-crystalline Si (25.6%) and GaAs (28.8%) solar cells. The current manufacturing process includes multiple steps, some of which, such as p-type back contact, for example, presents major practical challenges. Notably, the record energy conversion efficiency for a single-crystalline CdTe solar has not changed since the 1980s. Therefore, there remains a need for improvement of efficiency of CdTe-based heterostructures and CdTe thin-film solar-cell manufacturing based on such heterostructures. The question of whether it is possible to achieve much higher valued of $V_{OC}$ than in the polycrystalline materials also requires an answer.

SUMMARY

Double-heterojunction structures (of double heterostructures, DHs) configured conventionally with the use of II-VI semiconductors are known to inherit the shortcomings of these semiconductor materials, including all problems stemming from structural, physical, and operational detriments caused by having these materials doped (which detriments have to be corrected later on by, for example, annealing). This problem is addressed by creating, in the embodiments of DH of the invention, a p-n junction outside the absorber layer and the introduction of the barrier layer (configured to confine the electrical carriers) between the p- and n-layers of the DH structure.

Embodiments of photovoltaic cells built on the basis of the proposed DHs include an InSb substrate that carries a judiciously constructed double-heterojunction structure containing a CdTe-containing absorber layer sandwiched between first and second $Mg_xCd_{1-x}Te$-containing or $Zn_yCd_{1-y}Te$ barrier layers. The first and second barrier layers are configured to confine minority carriers to the absorber layer. (The absorber layer is characterized by an open-circuit voltage that, in the case of specific implementation, exceeds 1 V.)

Some of persisting problems blocking the way to achieving high $V_{oc}$ and high efficiency in CdTe solar cells include short bulk carrier lifetimes, high IRV values, and a low doping level of a p-contact, resulting in low built-in potential in the p-n junction, which limits the maximum achievable $V_{oc}$. Embodiments of the invention provide a solution to the problem with achieving long carrier lifetimes by structuring an embodiment of the invention to utilize the $CdTe/Mg_xCd_{1-x}Te$ DHs to employ high-quality monocrystalline CdTe epitaxially grown on InSb (001) substrate with the use of Molecular Beam Epitaxy (MBE). Embodiments further provide a solution to the problem caused by high interface recombination velocity (IRV) by lowering the value of IRV through utilizing such DHs in which a CdTe layer is sandwiched between two $Mg_xCd_{1-x}Te$ barrier layers and configured as an absorber layer. Additionally, p-contacts to CdTe have historically proven to be very challenging, as p-type doping in CdTe is known to be very challenging. This problem is solved by moving the p-type layer(s) out of the absorber region, and separate them using a $Mg_xCd_{1-x}Te$ barrier layer of the chosen DHs, thereby providing for a much broader choice of contact-layer materials (crystalline or amorphous) with various degrees and levels of structural imperfections, including those accommodating high levels of p-doping in CdTe absorbers, which are substantially higher than those previously known.

BRIEF DESCRIPTION OF DRAWINGS

FIG. 10B depicts a band-edge diagram for the device of FIG. 10A at equilibrium;

FIG. 10C depicts a schematic band edge diagram for the device of FIG. 10A under an open circuit condition;

FIG. 10D depicts a band edge diagram drawn to scale for the "hero" implementation of the device configured according to the structure of FIG. 10A, which demonstrated the highest efficiency;

FIG. 11 summarizes parameters used for the calculation of the quantified band diagrams of FIGS. 10A, 10B, 10C:

FIG. 14A: Measured J-V curve and associated device parameters. FIG. 14B: Measured EQE and (1-R) curve with a calculated photo-current of 22.3 mA*cm$^2$.

FIG. 17 tabulates the parameters used in the band-edge diagram simulations related to FIG. 16;

FIG. 25 summarizes operational parameters of several devices;

FIGS. 30A, 30B illustrate performance of the most efficient cell, structured according to the example of FIG. 29A, with an area of 5 mm by 5 mm. FIG. 30A: Light-JV curve under AM1.5G 0.1 W/cm$^2$ spectrum measured in-house. FIG. 30B: External Quantum Efficiency.

DETAILED DESCRIPTION

Figure 1:
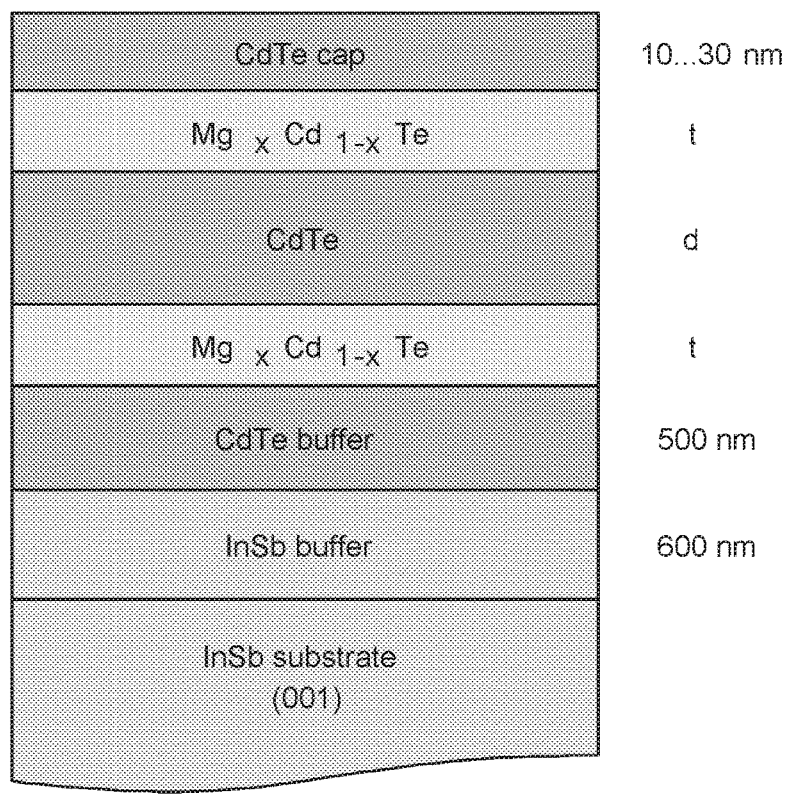
FIG. 1 is a schematic diagram of CdTe/MgCdTe DH.

Some of the thus-far not addressed challenges facing the CdTe-based photovoltaic (PV) cell technology include a lower-than-possible open-circuit voltage of the cell structure, $V_{oc}$ and intertwined with it insufficiently high built-in potential, poor p-contact, p-doping, and hole blocking. Indeed:

Silicon and GaAs solar cells have recently been demonstrated with efficiencies that are as high as 87% of their respective detailed-balance limits. Just like Si and GaAs materials, CdTe with a near optimum bandgap (1.48 eV) and a high absorption coefficient (>15,000 cm$^{-1}$) near the band edge is an excellent material for photovoltaic technology. Yet the efficiency of the best CdTe cell is only 67% of its detailed-balance limit due to excessive non-radiative recombination, the challenging p-type doping and its related adverse impact on minority carrier lifetime. Unlike the record Si and GaAs cells, which are made of monocrystalline materials and with wide-bandgap barrier/passivating layers at the absorber interfaces, the record CdTe cell is made of polycrystalline materials. The CdTe cell structures do not have a wide bandgap material (capable of not only providing carrier confinement but also offering low interface recombination velocity), and thus have a low open-circuit voltage $V_{oc}$ of 0.876 V as compared to a detailed-balance $V_{oc}$ of 1.23 V, which is most responsible for the relatively low efficiency of CdTe cells.

High quasi-Fermi-level splitting, which is a prerequisite to achieving high $V_{oc}$, requires long bulk carrier lifetime and low interface recombination velocity (IRV). Typical lifetimes of several nanoseconds in polycrystalline CdTe thin films, together with low achievable doping level in the p-region, limit the quasi-Fermi level splitting. Assumption of an acceptor density of $10^{15}$ cm$^{-3}$ and a carrier lifetime of 66 ns in bulk CdTe suggests that $V_{oc}$ values as high as 1.026 V could be enabled. Yet the best results for $V_{oc}$ of only 0.910 V, demonstrated for a monocrystalline CdTe wafer decades ago, remain unsurpassed. (For comparison, for the standard polycrystalline CdTe cell configuration with a CdS layer at the front and a metallic layer at the back, Kuciauskas et al. (*IEEE J. Photovoltaics* 3, 1319-1324, 2013) measured an IRV of approximately $10^5$ cm/s, which limits the effective lifetime to a few nanoseconds and the maximum possible $V_{oc}$ to roughly 0.9 V, depending on the CdTe thickness).

Furthermore, provided that excellent bulk carrier lifetime and low IRV are achieved, the high chemical potential (quasi-Fermi-level splitting) must be extracted at the contacts as an electrical potential to achieve high $V_{oc}$. For conventional polycrystalline thin-film CdTe solar cells, the n-type CdS layer at the front has a typical donor density of approximately $10^8$ cm$^{-3}$ and acts as an effective n-contact, while a lightly p-type doped CdTe absorber layer is used for p-contact. This arrangement is adopted because, as is known in the art, CdTe has been persistently difficult to be doped p-type, and thus the built-in voltage ($V_{bi}$) inside the cell is smaller than the achievable quasi-Fermi-level splitting in the absorber material, so that the chemical potential cannot be fully extracted as electrical potential.

It is appreciated, therefore that the three main problems blocking the way to achieving high $V_{oc}$ and high efficiency in CdTe solar cells are short bulk carrier lifetimes, high IRV values, and a low doping level of a p-contact. The practical implementations of the present invention provide solutions to the above-identified problems. Specifically:

a)—A problem with achieving long carrier lifetimes is solved by structuring an embodiment of the invention to utilize the CdTe/Mg$_x$Cd$_{1-x}$Te double heterostructures (DHs) employing high-quality monocrystalline CdTe epitaxially grown on InSb (001) substrate with the use of Molecular Beam Epitaxy (MBE). Using epitaxial CdTe as a demonstration platform and employing new passivation and p-contact layers in a double-heterostructure cell design, an ultra-high $V_{oc}$ and substantial increase in efficiency for monocrystalline CdTe solar cells are demonstrated.

b)—A problem caused by high interface recombination velocity, IRV, is solved by lowering the IRV via utilizing such DH structures in which a CdTe layer is sandwiched between two Mg$_x$Cd$_{1-x}$Te barrier layers and configured as an absorber layer: in this case, the wide-bandgap Mg$_x$Cd$_{1-x}$Te barriers effectively confine the minority carriers to the narrower-bandgap CdTe absorber. The straightforward and complete desorption of oxide layer on InSb substrate under Sb flux and the close to perfect lattice match between InSb and both CdTe (0.03% mismatch) and MgTe (0.9% mismatch), have enabled extremely low defect density, and thus very high structural and optical properties. The DH designs offer optimal confinement for minority carriers and excellent passivation to the surfaces of CdTe absorber layer.

c)—P-contacts to CdTe have historically proven to be very challenging, as CdTe is hard to complement with p-type dopants. This problem is solved by interface passivation of the Mg$_x$Cd$_{1-x}$Te barrier layers of the chosen DHs, thereby providing for a much broader choice of contact-layer materials (crystalline or amorphous) with various degrees and levels of structural imperfections, including those accommodating levels of p-doping in the case of CdTe absorbers that are substantially higher than those previously known.

Example 1

CdTe/MgCdTe DHs with Ultralow Interface Recombination Velocity.

Molecular Beam Epitaxy (MBE) grown monocrystalline CdTe/MgCdTe DHs on lattice-matched InSb substrates have demonstrated impressively long carrier lifetimes and low interface recombination velocity (IRV) due to effective carrier confinement and surface passivation provided by Mg$_x$Cd$_{1-x}$Te. However, both thermionic emission and tunneling effects can cause carrier loss over or through the Mg$_x$Cd$_{1-x}$Te barriers when the barrier potential is low or when the barrier is thin. Thus conventional carrier lifetime measurement(s) can only provide an effective value of IRV, which is the IRV that is purely due to recombination through interface trap states, and carrier loss due to thermionic emission and tunneling.

It was empirically demonstrated that (a) by conducting temperature dependent carrier lifetime measurements, the thermionic-emission-induced interface recombination can be distinguished, and that (b) by comparing samples with different barrier layer thicknesses, the contribution of the tunneling effect into effective value of IRV can be quantified. Thermionic emission and tunneling effects were used, therefore, to explain the dependence of IRV on the Mg$_x$Cd$_{1-x}$Te barrier layers. Temperature-dependent time-resolved photoluminescence (TRPL) measurements were carried out and a theoretical model was developed to explain the thermionic emission induced recombination at the CdTe/Mg$_x$Cd$_{1-x}$Te interface.

Obtained experimental results evidenced at, when both thermionic emission and tunneling effects are eliminated or greatly suppressed, the actual value of the IRV was measured to be ultralow approximately 1 cm/s (close to the lowest value of 1.5 cm/s reported for GaAs/In$_{0.5}$Ga$_{0.5}$P DHs), thereby indicating that $Mg_xCd_{1-x}Te$ can be a well-suited surface passivation material for CdTe solar cells utilizing the CdTe-based DHs. At the same time, a very long carrier lifetime of 3.6 μs was observed.

CdTe/$Mg_xCd_{1-x}Te$ DHs, as shown in FIG. 1, are grown on lattice-matched InSb (001) substrates by using MBE. (Detailed growth conditions have been reported previously in DiNezza M. J., et al., Appl. Letts., v. 103, 193901, 2013.) A CdTe cap layer is grown to prevent $Mg_xCd_{1-x}Te$ from oxidization. Time-resolved photoluminescence (TRPL) measurements were carried out using a time-correlated single-photon-counting system. The excitation sources included an ultra-fast Ti:Sapphire laser and a Fianium fiber laser. The samples, with CdTe middle layer thickness d larger than 0.3 μm, were excited by Ti:Sapphire laser with a 750 nm output wavelength. For samples with thinner CdTe layers, the Fianium laser with a 550 nm output wavelength was used to ensure full absorption of the laser. With the use of capacitance-voltage measurements, it was estimated that the background carrier concentration of the CdTe layer was in the middle $10^{14}$ cm$^{-3}$ level. Thus the initial excited carrier concentration had to be much lower than this value to ensure low injection. A liquid nitrogen cooled cryostat was used for low temperature measurements.

Table I shows the measured effective carrier lifetime ($\tau_{eff}$) for all different CdTe/$Mg_xCd_{1-x}Te$ DH samples. For samples with the same barrier layer design, the effective IRV is extracted by using Eq. (1)

$$\frac{1}{\tau_{eff}} = \frac{1}{\tau_{bulk}} + \frac{2S_{eff}}{d},\qquad(1)$$

where $\tau_{bulk}$ is the bulk carrier lifetime in the CdTe middle layer, $S_{eff}$ is the effective IRV, and d is thickness of the CdTe middle layer. The effective carrier lifetime increases as a function of the thickness of CdTe as shown in Table I, which implies the reduced equivalent interface recombination as the middle CdTe layer gets thicker.

It was usually assumed by researchers that $\tau_{bulk}$ has a constant value. This, however, is not the case when photon recycling effect is considered. As the CdTe middle layer becomes thicker, photon recycling effect is stronger and the radiative lifetime increases. For samples with very long carrier lifetimes (such as samples with 30 nm $Mg_{0.46}Cd_{0.54}Te$ barriers), where radiative recombination may dominate at room temperature, the thickness dependent carrier lifetime can be primarily due to photon recycling effect rather than interface recombination. Thus radiative lifetime was extracted from the effective lifetime, before the fitting using Eq. (1). (The detailed description of the fitting method can be found in Liu S., et al., Appl. Phys. Letts., v. 107, 041120, 2015.)

Table II summarizes the effective IRV as a function of barrier layer thickness and Mg composition in the barrier. It was found that for samples with 30 nm barriers, as the Mg composition increases from 24% to 46%, the effective IRV decreases dramatically from 470 cm/s to only about 1.4 cm/s. For the same Mg (46%) composition, the IRV increases to 30 cm/s when the barrier thickness is reduced to 15 nm.

It was contemplated, therefore, that for samples with barriers with lower Mg compositions (24% and 36%), but still of sufficient thickness (20~30 nm), the primary contribution to the effective value of IRV is provided by thermionic emission of excess carriers over the barriers, as the barrier potentials are lower in these samples. For samples with thinner barriers (15 nm), but still with high Mg composition, (46%), the effective IRV is contributed by excess carriers tunneling through the barrier layers. When both thermionic emission and tunneling effect are suppressed, the measured IRV (~1 cm/s) is purely due to recombination through interface trap states, i.e. interface Shockley-Read-Hall (SRH) recombination. Such a low IRV value indicates that the interface quality between CdTe and $Mg_xCd_{1-x}Te$ is very high.

Figure 2:
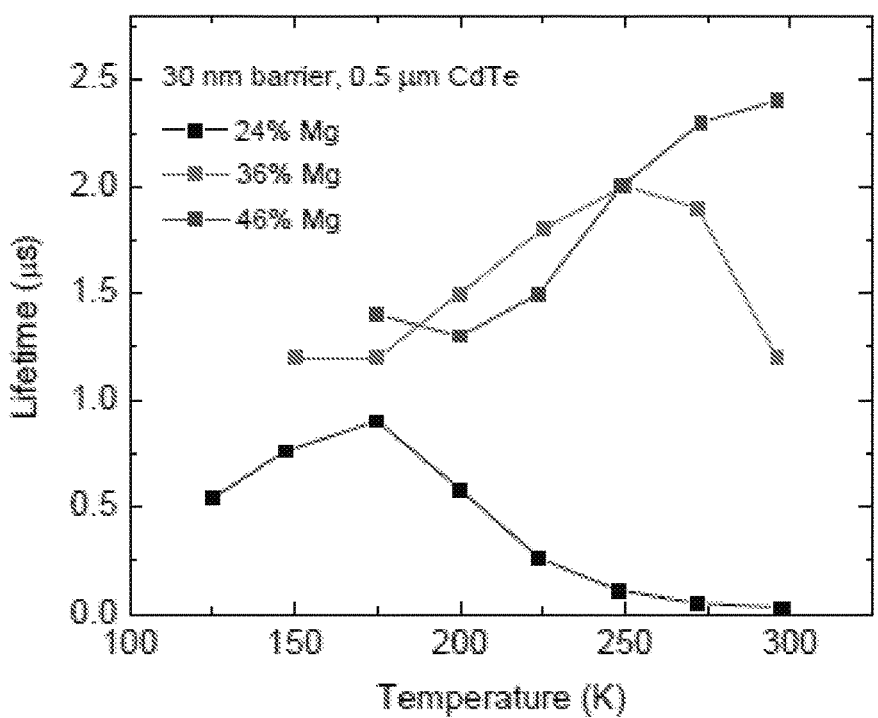
FIG. 2 illustrates temperature-dependent carrier lifetime of $CdTe/Mg_xCd_{1-x}Te$ DHs with 30 nm barriers and 0.5 μm CdTe middle layer, but with different Mg compositions in the barriers.

Temperature-dependent TRPL measurements were carried out for samples #2, #7 and #11, which have 30 nm barrier layers, but with different Mg compositions (i.e. barrier potential). FIG. 2 shows the results for the 3 samples, and FIGS. 3, 4, and 5 illustrate the carrier lifetime fitting using different recombination mechanisms.

Figure 3:
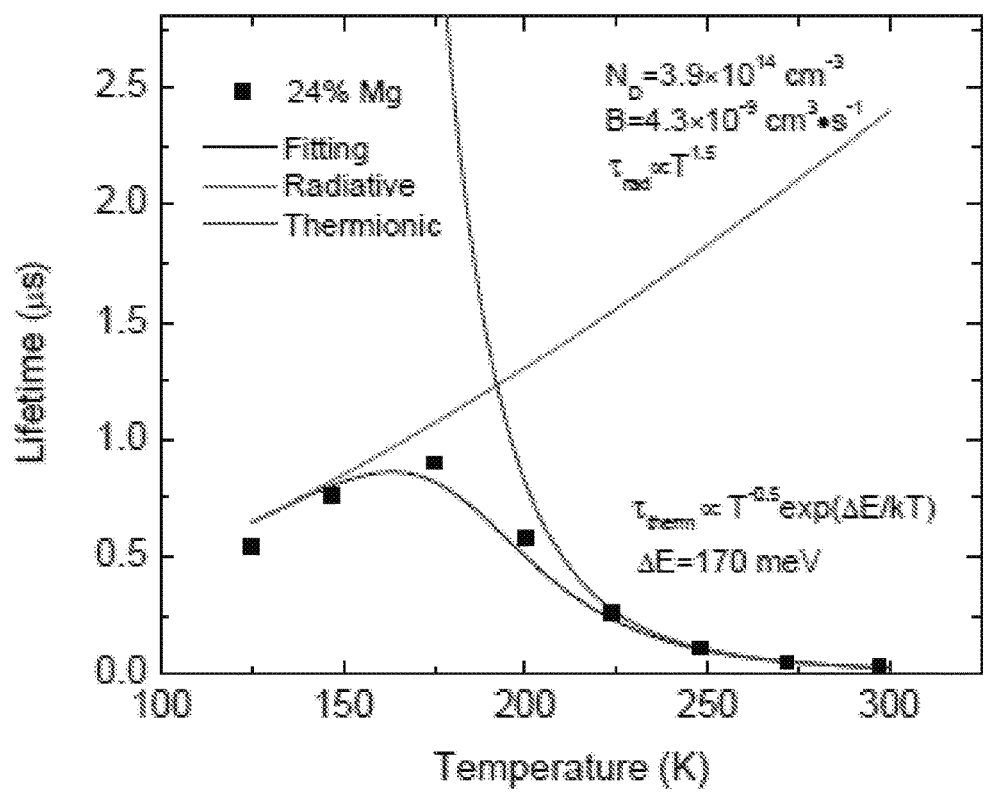
FIG. 3 depicts fitting of temperature-dependent carrier lifetime of $CdTe/Mg_{0.24}Cd_{0.6}Te$ DH with 30 nm barriers.
Figure 4:
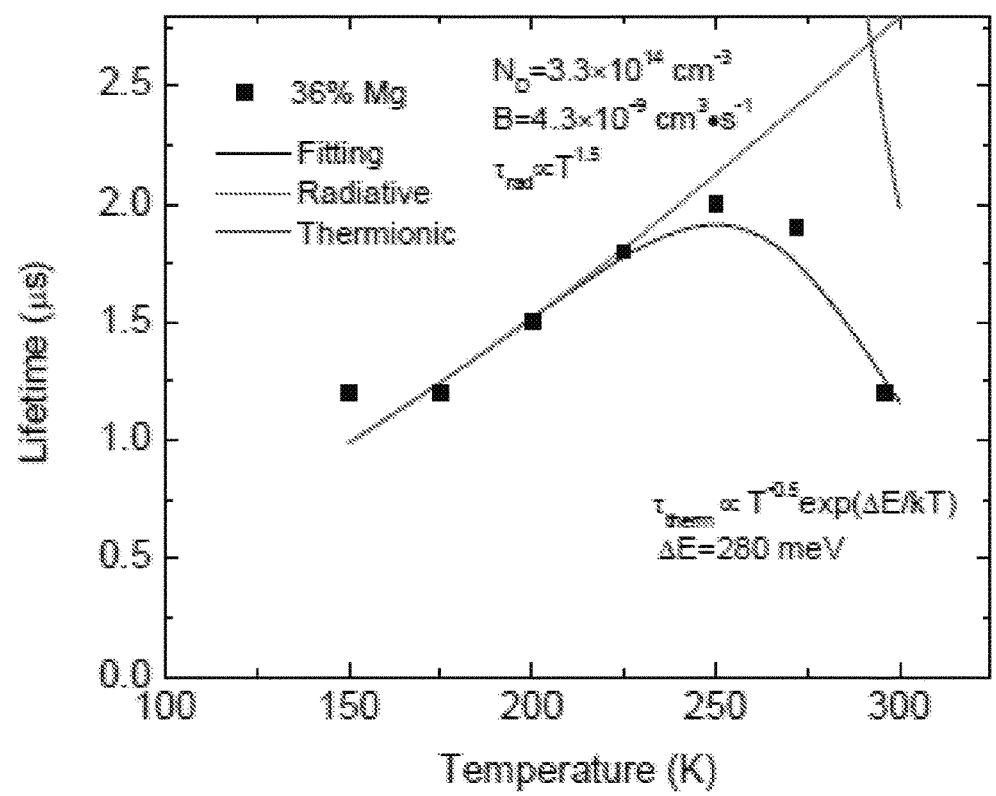
FIG. 4 depicts fitting of temperature-dependent carrier lifetime of $CdTe/Mg_{0.36}Cd_{0.64}Te$ DH with 30 nm barriers.
Figure 5:
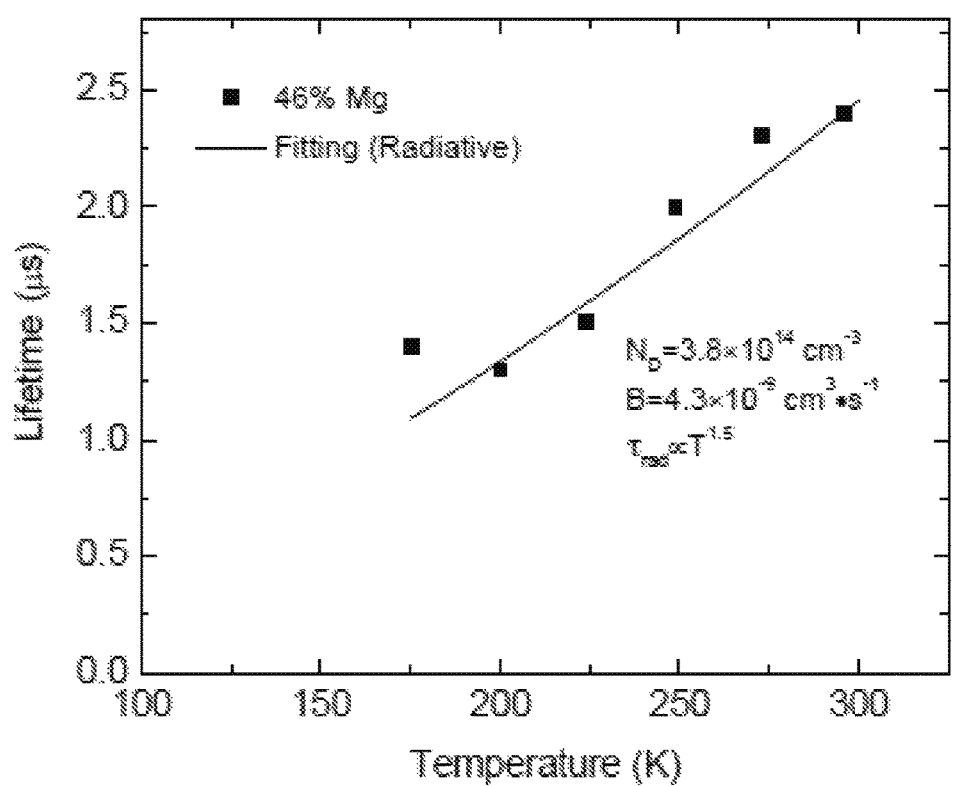
FIG. 5 depicts fitting of temperature-dependent carrier lifetime of $CdTe/Mg_{0.46}Cd_{0.54}Te$ DH with 30 nm barriers.

From the fitting results of FIGS. 3, 4, and 5, it was found that the measured carrier lifetimes are partially contributed by thermionic emission induced interface recombination for samples with lower Mg (24% and 36%) in the barriers at high temperatures. For samples with 46% Mg in the barrier, the recombination was dominated by radiative recombination at all temperatures, suggesting the very high material qualities (at bulk and interfaces).

TABLE I

Measured carrier lifetime of CdTe/$Mg_xCd_{1-x}Te$ double heterostructures with different designs. The effective interface recombination velocity ($S_{eff}$) is extracted according to Eq. (1).

| $Mg_xCd_{1-x}Te$ Barrier | Sample # | d (μm) | $\tau_{eff}$ (μs) | $S_{eff}$ (cm/s) |
|---|---|---|---|---|
| t = 30 nm 24% Mg | 1 | 0.3 | 0.031 | 470 ± 40 |
| | 2 | 0.5 | 0.042 | |
| | 3 | 1 | 0.086 | |
| | 4 | 2 | 0.18 | |
| t = 30 nm 36% Mg | 5 | 0.2 | 0.24 | 54 ± 32 |
| | 6 | 0.33 | 0.28 | |
| | 7 | 0.5 | 1.1 | |
| t = 30 nm 46% Mg | 8 | 0.2 | 2.2 | 1.4 ± 0.6 |
| | 9 | 0.25 | 2.2 | |
| | 10 | 0.33 | 2.8 | |
| | 11 | 0.5 | 3.6 | |
| t = 22 nm 46% Mg | 12 | 0.2 | 2.0 | 1.2 ± 0.7 |
| | 13 | 0.25 | 2.2 | |
| | 14 | 0.33 | 2.8 | |
| | 15 | 0.5 | 3.0 | |
| t = 15 nm 46% Mg | 16 | 0.2 | 0.18 | 30 ± 10 |
| | 17 | 0.25 | 0.31 | |
| | 18 | 0.33 | 0.47 | |
| | 19 | 0.5 | 0.83 | |
| | 20 | 1 | 0.75 | |
| t = 20 nm 36% Mg | 21 | 0.25 | 0.15 | 61 ± 14 |
| | 22 | 0.33 | 0.18 | |
| | 23 | 0.5 | 0.30 | |
| | 24 | 1 | 0.40 | |

TABLE II

CdTe/$Mg_xCd_{1-x}Te$ effective interface recombination velocity ($S_{eff}$) vs. the barrier thickness t and the Mg composition in the barrier.

| | $S_{eff}$(cm/s) Mg (%) | | |
|---|---|---|---|
| t (nm) | 24 | 36 | 46 |
| 15 | NA | NA | 30 |
| 20~22 | NA | 61 | 1.2 |
| 30 | 470 | 54 | 1.4 |

Example 2

CdTe/MgCdTe DHs with Increased Radiative Recombination Rate.

Although CdTe has low p-type dopability, it can be easily doped n-type, and an electron concentration up to $10^{18}$ cm$^{-3}$ has been achieved by Indium doping. As discussed below, the n-type CdTe/MgCdTe DHs grown on InSb substrates we subjected to Photoluminescence Quantum Efficiency (PLQE) measurements. PLQE accounts for the luminescence escaped from the sample top surface to free space, and so it is also referred to as external luminescence quantum efficiency ($\eta_{ext}$). The spontaneous emission quantum efficiency ($\eta_q$) is calculated from the measured $\eta_{ext}$ by taking into account the sample structure and the absorption of the substrate.

In reference to the specific implementation of the DH of FIG. 1 (with x=0.46, where the d=1,000 absorber layer is sandwiched between two t=15 nm thick barrier layers; the overall region defined by the CdTe layer and the two sandwiching it layers of MgCdTe being the doped region; and thickness of CdTe cap of 30 nm), such DH was grown on InSb (001) substrate using a dual-chamber MBE system. A 30 nm CdTe cap layer was used to protect the DH. Note that the 1-□m absorber thickness was chosen because it was able to absorb 98% of the above-bandgap-photons under irradiation having the AM1.5 spectrum. Different implementations of such DH were doped with Indium at concentrations ranging from $1\times10^{16}$ cm$^{-3}$ to $1\times10^{18}$ cm$^{-3}$. The Indium dopant was fully ionized at room temperature, and the electron concentration was equal to the dopant concentration. Specifically, the layer structure of the five studied Indium-doped n-type CdTe/Mg$_{0.6}$Cd$_{0.54}$Te DHs had doping levels of $1\times10^{16}$ cm$^{-3}$, $6\times10^{16}$ cm$^{-3}$, $1\times10^{17}$ cm$^{-3}$ $6\times10^{17}$ cm$^{-3}$, and $1\times10^{18}$ cm$^{-3}$, respectively.

Figure 6A:
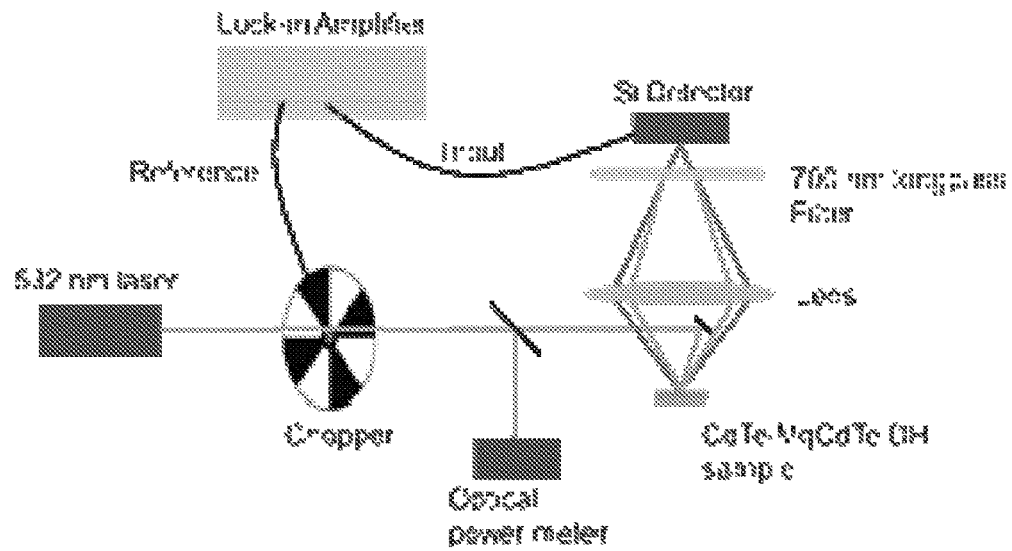
FIGS. 6A, 6B schematically illustrates an experimental set-up for measurement of the Photoluminescence Quantum Efficiency (PLQE), or external luminescence quantum efficiency $\eta_{ext}$. The $\eta_{ext}$ of the CdTe/MgCdTe double-heterostructure (DH) sample was obtained by comparing the PL from the DH sample (FIG. 6A), and the scattered laser light from a Lambertian reflector (FIG. 6B).
Figure 6B:
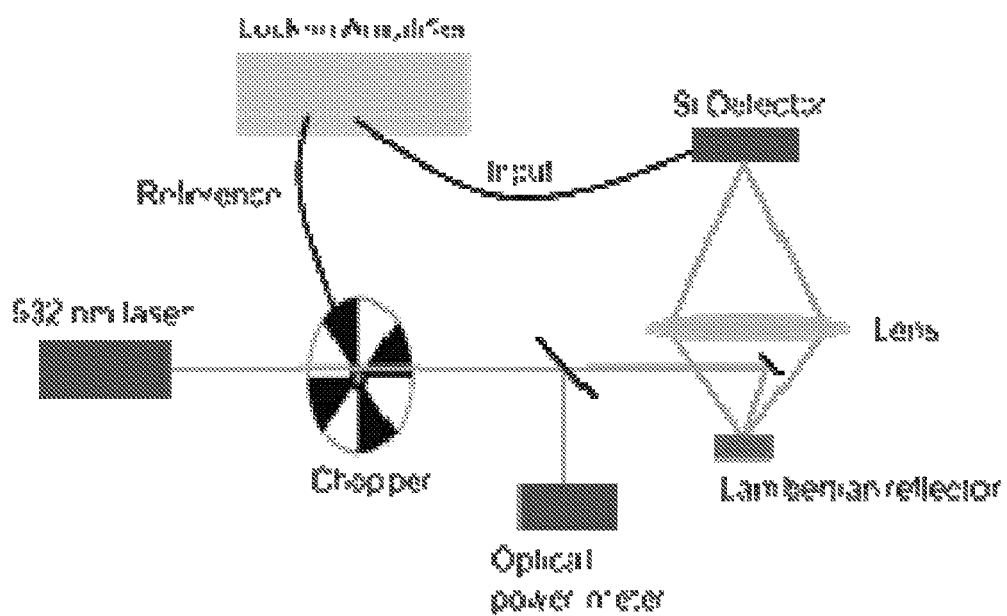

The $\eta_{ext}$ measurement setup, as shown in FIGS. 6A, 6B, was configured to acquire and compare the PL of a CdTe/MgCdTe DH sample with the scattered light from a Spectralon Lambertian reflector. The used excitation source was a 532 nm diode pumped solid state (DPSS) laser with a beam radius of 0.54±0.01 mm (as measured on the sample).

As shown in FIG. 6A, when the laser light illuminates the Lambertian reflector, the reflector scatters the incident light back into free space following the Lambertian angular distribution. A portion of the scattered light is collected by the lens and measured by a Silicon detector as reference signal. The reference signal ($S_{ref}$) reading on the lock-in amplifier is:

$$S_{ref} = R_{ref}\phi_{laser}C_{laser} \qquad \text{Eq. (2)}$$

where $R_{ref}$ is the reflectance of the Lambertian reflector, $\phi_{laser}$ is the photon-flux of the excitation laser. $C_{laser}$ is the throughput of the optical setup at the laser wavelength, which includes the contributions from the lens, and the responsivity of the photodetector.

As shown in FIG. 6B, when the laser illuminates the PL sample, the sample emits PL with a peak wavelength of 820 nm. The angular distribution is also Lambertian. PL is collected by the lens and passes through a long-pass filter before entering the Si detector. The long-pass filter prevents the scattered laser light from entering the Si detector. The signal reading ($S_{PL}$) on the lock-in amplifier is:

$$S_{PL} = \phi_{PL}C_{PL} \qquad \text{Eq. (3)}$$

where $\phi_{PL}$ is the total photon-flux of PL from the sample. $C_{PL}$ is the throughput of the optical setup at the PL, which includes the contributions from the lens, the longpass filter and the responsivity of the photodetector. The radio of $C_{laser}/C_{PL}$ can be accurately estimated by considering the transmission curves of the lens and the longpass filter, and the responsivity of the photodetector at two wavelengths.

The total photon-flux of the PL ($\phi_{PL}$) from the sample is calculated as:

$$\phi_{PL} = R_{ref}\phi_{laser}\frac{S_{PL}}{S_{ref}}\frac{C_{laser}}{C_{PL}} \qquad \text{Eq. (4)}$$

The $\eta_{ext}$ is the ratio of the number of luminescence photons to the number of absorbed photons:

$$\eta_{ext} = \frac{\phi_{PL}}{A_{DH}\phi_{laser}} \qquad \text{Eq. (5)}$$

where $A_{DH}$ is the absorptance of the double-heterostructure at the laser wavelength. For the sample structure shown in FIG. 1, $A_{DH}$ is calculated to be 55% at the laser wavelength using wave optics.

Figure 7:
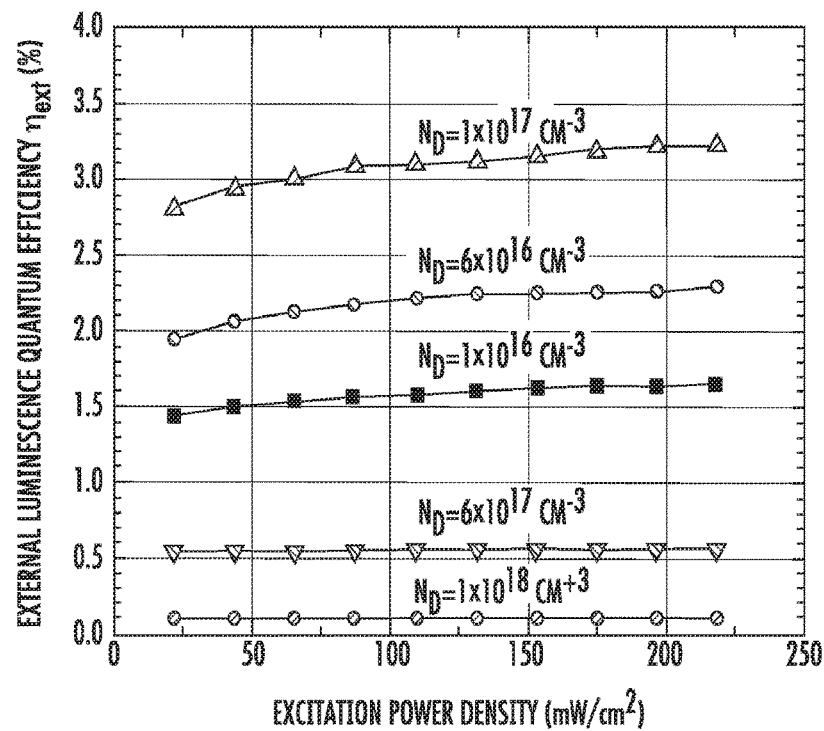
FIG. 7 illustrates the external luminescence quantum efficiency ($\eta_{ext}$) as a function of the excitation power density for indium-doped n-type samples with carrier concentration ranging from $10^{16}$ cm$^{-3}$ to $10^{18}$ cm$^{-3}$.
Figure 8:
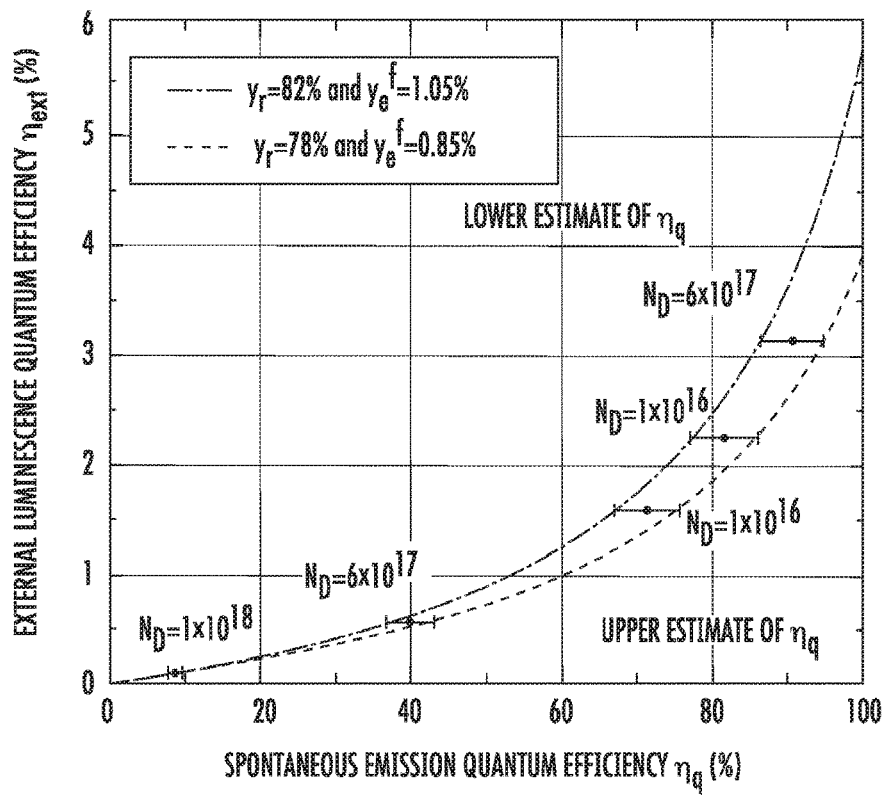
FIG. 8 shows External luminescence quantum efficiency ($\eta_{ext}$) as a function of spontaneous emission quantum efficiency ($\eta_q$). The lower estimate of $\eta_q$ is shown in the line with =82% and =1.05%; the upper estimate of $\eta_q$ is the line with =78% and =0.85%. The measured $\eta_{ext}$ and the estimation of $\eta_q$ of five CdTe/MgCdTe DH samples with different doping levels are also illustrated.

The $\eta_{ext}$ as function of excitation power density of five n-type CdTe/MgCdTe DH samples with different doping levels are shown in FIG. 7. The $\eta_{ext}$ value is almost constant as the power density varies from 20 to 200 mW/cm$^2$. The TRPL measurements revealed a carrier lifetime of 110 ns in the sample doped at $1\times10^{16}$ cm$^{-3}$. Under 200 mW/cm$^2$ excitation, the excess carrier density is estimated to be $3\times10^{14}$ cm$^{-3}$, much lower than the doping levels, which explains the relative independence of $\eta_{ext}$ on the excitation power density.

$\eta_{ext}$ is related to the $\eta_q$ through Eq. (6):

$$\eta_{ext} = \frac{\eta_q \gamma_e^f}{1 - \eta_q \gamma_r} \qquad \text{Eq. (6)}$$

where $\gamma_e^f$ is the photon-extraction factor from the front surface, the probability of a luminescence photon to escape from the front surface to the free space. $\gamma_r$ is the photon-recycling factor, the probability of a luminescence photon to be reabsorbed in the absorber region. Using the method presented in (Steiner M. A., et al., J. Appl. Phys., 112, 123109, 2013), $\gamma_e^f$ and $\gamma_r$ are calculated to be 0.95±0.1% and 80±2%, respectively. Notably, he $\gamma_e^f$ and $\gamma_r$ calculations are very sensitive to the absorber layer thickness and the absorption coefficient of CdTe near the band edge, which is difficult to measure accurately, thereby leading to the large error bar of these two parameters. With these parameters, the relation between ext and $\eta_q$ is shown in FIG. 4, along with the measured $\eta_{ext}$ of CdTe/MgCdTe DHs at various doping levels.

The implied $V_{oc}$ is calculated using Eq. (7):

$$iV_{oc} = V_{db} - \frac{kT}{q}|\ln(\eta_{ext})| \qquad \text{Eq. (7)}$$

where $V_{db}$ is the open-circuit voltage at the detailed-balance limit.

The $V_{db}$ for 1-□m-thick CdTe solar cells on an absorbing substrate is calculated to be 1.22 V using the Eq. (7) from Ganapati V., et al., IEEE J. of Photovoltaics, 2016. The measurement results on five n-type CdTe/MgCdTe DH samples with different doping levels are summarized in Table III. A maximum $\eta_{ext}$ of 3.1% is observed from the sample with a doping concentration of $1\times10^{17}$ cm$^{-3}$ at one-sun 100 mW/cm$^2$ power density. $\eta_{ext}$ drops for lightly doped ($N_D \leq 6\times10^{16}$ cm$^{-3}$) and heavily doped ($N_D \geq 6\times10^{17}$ cm$^{-3}$) samples. The $\eta_{ext}$ of 3.1% corresponds to an $\eta_q$ of 91±4%. i.e. about 91% carriers recombine radiatively in the absorber. The sample has a maximum implied $V_{oc}$ of 1.13 V, which is approaching to the theoretical limit of 1.17 V for CdTe solar cells with an absorbing substrate, which is smaller than the detailed-balance limit $V_{oc}$.

TABLE III

Summary of Measurement Results.

| | Sample Number | | | | |
|---|---|---|---|---|---|
| | A1712 | A1695 | A1707 | A1694 | A1699 |
| $N_D$ (cm$^{-3}$) | $1 \times 10^{16}$ | $6 \times 10^{16}$ | $1 \times 10^{17}$ | $6 \times 10^{17}$ | $1 \times 10^{18}$ |
| $\eta_{ext}$ at one sun | 1.6% | 2.2% | 3.1% | 0.55% | 0.09% |
| $\eta_q$ | 71 ± 4% | 82 ± 4% | 91 ± 4% | 40 ± 3% | 8.9 ± 0.9% |
| Implied $V_{oc}$ (V) | 1.11 | 1.12 | 1.13 | 1.09 | 1.04 |

High implied $V_{oc}$ is a prerequisite for high V for solar cells. Electrons and holes should selectively transport to their respective contacts to achieve a high $V_{oc}$. We have shown that p-type a-SiC$_x$:H are effective hole-selective contacts for CdTe solar cells, achieving a high $V_{oc}$ of 1.096 V [14].

As Example 2 demonstrated, therefore, the non-radiative recombination inside of and at the interface of CdTe absorber was been significantly reduced due to the use of lattice-matched InSb substrates, and the excellent passivation provided by the MgCdTe barrier layers. Moderately doped ($N_D$ between $10^{16}$ and $10^{17}$ cm$^-$) n-type CdTe/MgCdTe DH samples became radiative recombination dominated. The maximum external luminescence quantum efficiency ($\eta_{ext}$) of 3.1% was measured from a 1-□m-thick n-type CdTe/MgCdTe DH with doping concentration of $1\times10^{17}$ cm$^{-3}$, corresponding to a spontaneous emission quantum efficiency ($\eta_q$) of 91±4%, and an implied $V_{oc}$ of 1.13 V, which was only 0.37 V below the bandgap of CdTe. With the high quantum yield, the CdTe/MgCdTe DHs demonstrated a new efficiency record for monocrystalline CdTe cells.

Example 3

Solar Cells Based on Monocrystalline CdTe/MgCdTe DHs with Open-Circuit Voltage Over 1V and Efficiency of 17%

Figure 9:
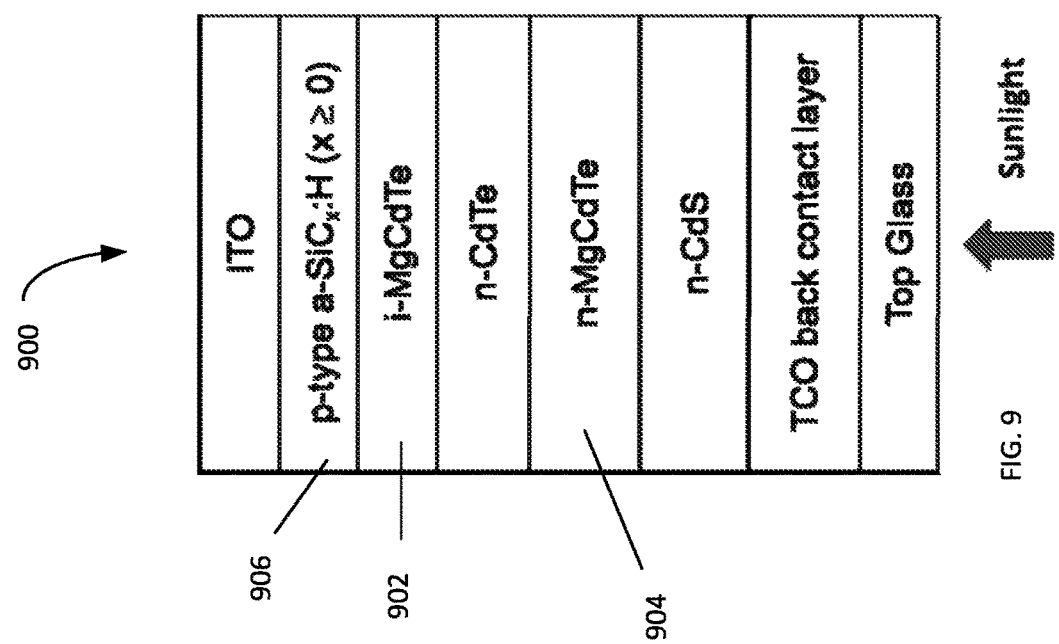
FIG. 9 depicts a schematic diagram of a proposed device structure based on polycrystalline DH configured according to the idea of the invention.

In reference to FIG. 9, an example of a schematic of a novel CdTe thin-film solar cell device 900 is structured according to conventional p-on-n material configuration and n-type contact layers. Layers 902, 904 of the CdTe/MgCdTe double heterostructure are used as absorbers to confine photogenerated minority carriers and to prevent the photogenerated minority carriers, electrons or holes, from reaching p- or n-contacts, respectively. The MgCdTe layers 902, 904 not only provide an excellent passivation to the CdTe surface, but also substantially reduce the surface and interface recombination velocity. A p-type a-SiC$_x$:H contact layer 906, which can be doped heavily, and has a desirable band edge alignment with that of CdTe and MgCdTe to provide large built-in potential inside the solar cell.

With these innovative features in place, it is anticipated that the new solar cell configured in a fashion similar to that of 900 will address all the challenges mentioned above and offer much improved performance at a lower cost. It is also worth noting that the p-type a-SiC$_x$:H layer 106 can be deposited using plasma-enhanced chemical vapor deposition (PECVD) at low temperatures, which is a well-established low-cost technique used in the manufacturing of amorphous Si thin-film solar cells and HIT (Heterojunction with Intrinsic Thin Layer) cells.

Figure 10A:
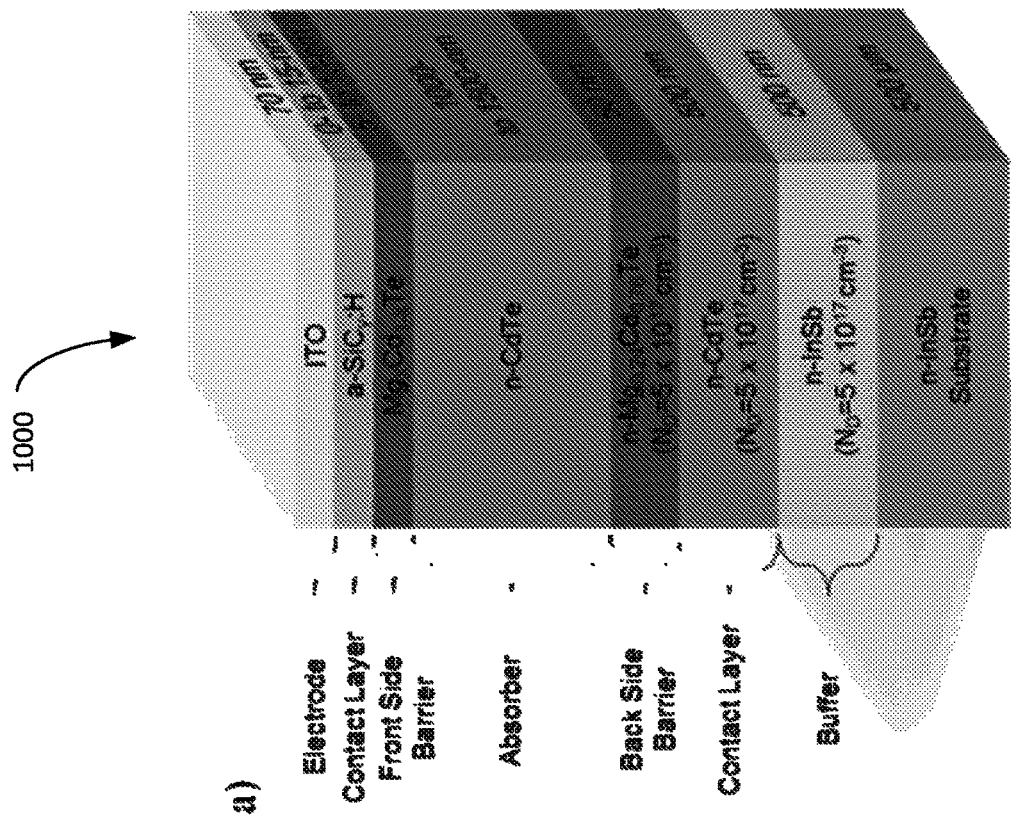
FIG. 10A shows a structure of a prototype device configured according to the idea of the invention with the use of a single-crystal absorber region grown on lattice-matched InSb substrate: a layer structure of the CdTe/Mg$_x$Cd$_{1-x}$Te double-heterostructure solar cell with a p-type contact layer (hole contact layer), a-SiC$_y$:H (y=0~6%).

To test the feasibility of the new idea presented in FIG. 9, a very similarly structured solar cell device 1000 shown in FIG. 10A was realized.

This device structure affords new opportunities with respect to addressing the challenge of p-type doping in CdTe: with interface passivation provided by the Mg$_x$Cd$_{1-x}$Te barrier layers, one can afford to have the contact layers with defects. Such a desirable property enables a much broader choice of contact layer materials, which may be either crystalline or amorphous.

The structure of FIG. 10A maintains the voltage of the solar cell 1000 by preventing the contact layers from compromising the absorber quality, as the minority carriers in the CdTe absorber will be confined by the barriers. That is, heterostructure barriers offer an alternative way to construct a junction in CdTe solar cells that circumvents the major challenge of p-type doping and facilitates novel device structure designs. It is appreciated that the front contact layer should preferably be as transparent as possible to minimize parasitic absorption (which absorption reduces the photogenerated current of the solar cell).

To construct the device 1000, a 5-nm to 15-nm-thick heavily doped p-type amorphous silicon (a-Si:H, estimated doping level of $10^{18}$ cm$^{-3}$) or amorphous silicon carbide (a-SiCy:H, y~6%) layer was used as the p-type contact. These layers were deposited by plasma-enhanced chemical vapour deposition on the front Mg$_x$Cd$_{1-x}$Te barrier, followed by an indium tin oxide (ITO) electrode deposited by sputtering. The schematic band diagrams are shown in equilibrium and at open circuit conditions, in FIGS. 10B and 10C, respectively. Notably, the band diagrams of FIGS. 10B, 10C represent several different structure designs and are thus not drawn to scale with respect to energy and length. The parameters used for the quantified band diagram calculations are summarized in FIG. 11.

The intent of the design is to ensure that the barrier/contact stacks block the transport of minority carriers to the contacts while permitting majority carriers to flow unimpeded—minority carriers referring to the minority carrier type of each respective contact layer, not the absorber. The Mg$_x$Cd$_{1-x}$Te barrier at the front (hole-contact side) of the device 1000 should be judiciously chosen, without compromising the effectiveness of the passivation of the CdTe absorber, to enable transport of holes across the barrier while simultaneously blocking electrons with the large conduction-band offset. Notably, the simulated open-circuit band diagram in FIG. 10C indicates a small $V_{OC}$ loss at the p-type contact because of the negative valence-band offset present between a-Si:H and CdTe layers.

The motivation for adding carbon to form a-SiCy:H layer was to achieve a smaller valence-band offset, and thus a lower voltage drop. Because the conduction-band offset is large, the 50-nm-thick Mg0.24Cd0.76Te barrier at the back (electron-contact side) of the device was heavily doped n-type to facilitate transport of electrons and impede holes.

Although more than eight wafers of different designs were used in practice, the following disclosure focuses on two designs. Design A included a hole-contact layer (8 nm a-SiCy:H and 4 nm a-Si:H, y~6%), a 10-nm-thick undoped Mg0.30Cd0.70Te front barrier, and a 1-micron-thick absorber with n-type In doping at $3*10^{16}$ cm$^{-3}$ level. Design B included of a hole-contact layer (8 nm a-Si:H), a 10-nm-thick undoped Mg0.30Cd0.70Te front barrier, and a 1.4-micron-thick absorber with n-type In doping at $1*10^{16}$ cm$^{-3}$ level for the top 1 micron-thick portion of the absorber layer and at level of $5*10^{17}$ cm$^{-3}$ for the bottom 0.4 micron thick portion of the absorber layer. FIG. 10D demonstrates an equilibrium band diagram drawn to scale for the "hero" cell design (Design B) of device 1000 that demonstrated the highest conversion efficiency.

Solar Cell Characterization.

Figure 12A:
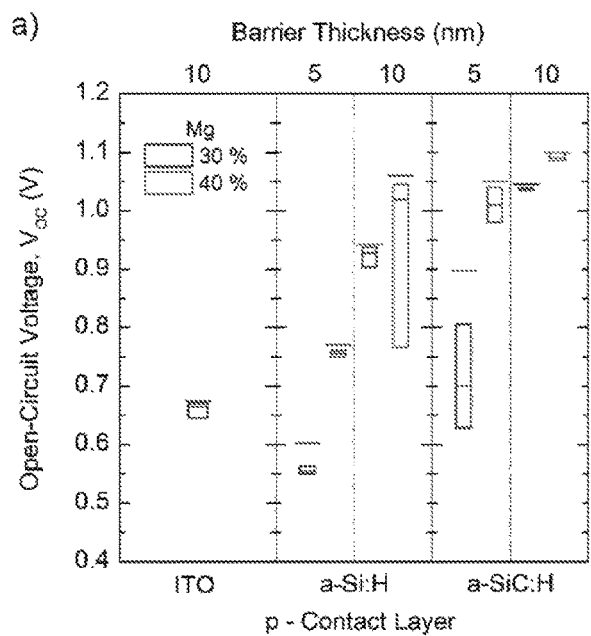
FIG. 12A is a box plot illustrating the average and maximum $V_{OC}$ for several designs of a solar cell with different hole-contact layers, and barrier thicknesses and heights. The upper and lower bounds of the boxes indicate the 25$^{th}$ and 75$^{th}$ quartiles.

(Methodologies for MBE material growth, XRD measurements, PL/TRPL measurements, J-V measurements, and EQE measurements are discussed below). After the growth of the underlying DH, the wafers were processed into devices. FIG. 12A shows the average and maximum Voc of a series of solar cells according to the sign of FIG. 10A with 8- to 12-nm-thick a-Si:H and a-SiCy:H hole-contact layers. For each contact material, the front MgxCd1-xTe barrier width and height (Mg composition, x) were also explored. A low level of Voc was measured even in the absence of an intentional hole-contact layer, because the ITO-layer itself is slightly hole selective (due to its relatively high work function of 4.8 eV). Inserting a heavily doped p-type a-Si:H contact layer yields a greatly enhanced Voc because of the increase in Vbi (which was determined to be 1.1V using capacitance-voltage, C-V, measurements. As anticipated from TRPL studies of DHs discussed above, the level of Voc rises as the front barrier height or width increases because electrons are further confined to the CdTe absorber layer as thermionic emission and tunnelling are suppressed. The Voc further increases to a maximum measured value of 1.096 V when p-type a-SiCy:H is used, which has a wider bandgap and lower (negative) valence-band offset than that of a-Si:H. The solar cells with the highest Voc values, however, do not tend to have the highest efficiencies owing to smaller fill factors (FF).

Figure 12B:
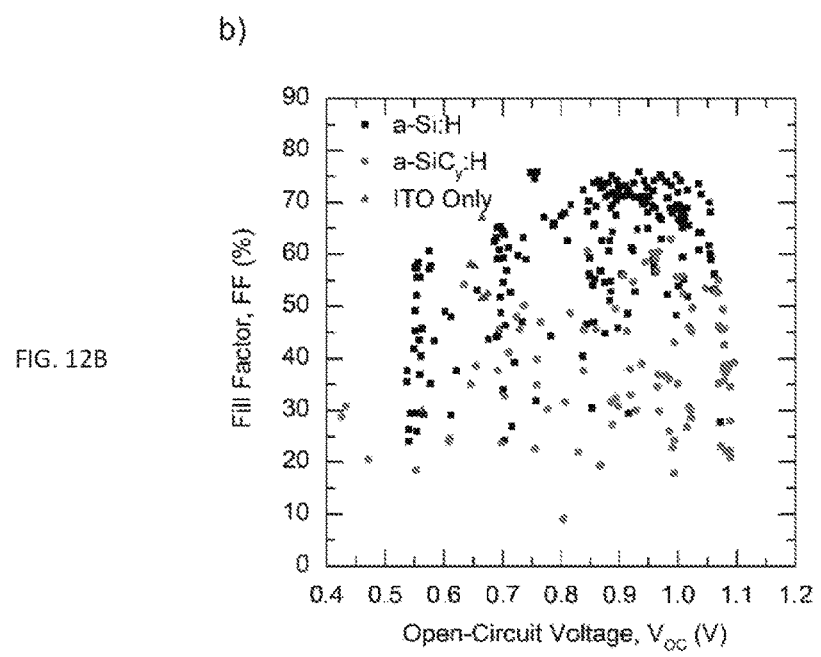
FIG. 12B is a plot showing the fill factor as a function of $V_{OC}$ for individual devices implemented according to the idea of the invention and associated with FIG. 12A.

FIG. 12B shows the FF against the Voc for all solar cells that have been measured. Notably, the cells with a-SiCy:H all have lower FF than their a-Si:H counterparts, which was attributed to a lower doping level than that in the a-Si:H layer, which inhibits transport across the heterojunction interfaces between the a-SiCy:H hole-contact layer and the ITO layer and MgxCd1-xTe front barrier layer. This effect practically increases the lumped series resistance of the cell.

Figure 13A:
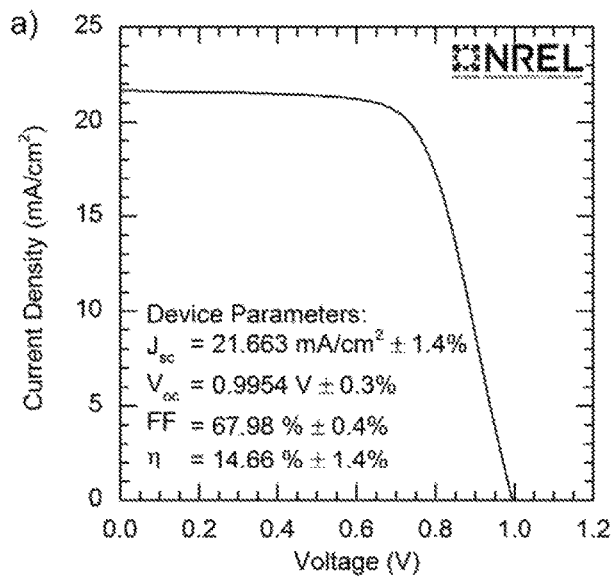
FIG. 13A is a plot illustrating the J-V curve for a solar cell sample with a 10 nm thick Mg$_{0.30}$Cd$_{0.70}$Te barrier and an 8 nm thick a-Si:H hole-contact layer. The device under test had a square area, of 0.21 cm$^2$.
Figure 13B:
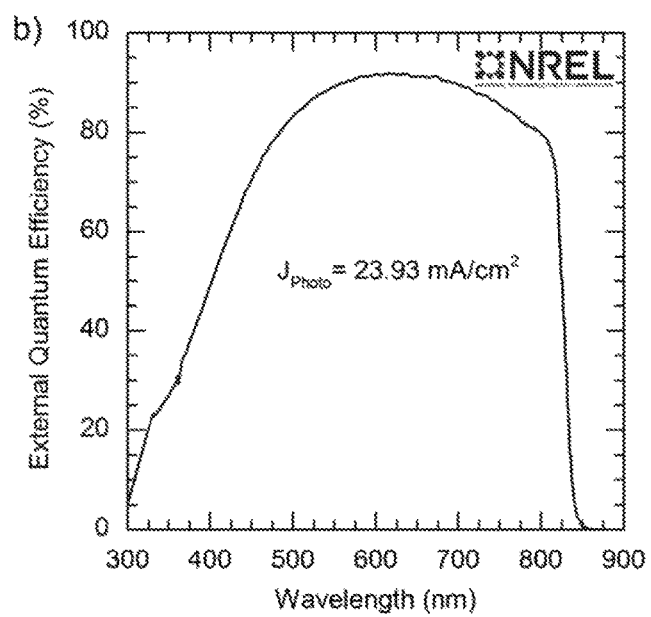
FIG. 13B is a plot illustrating the EQE for the device shown in FIG. 13A.

A 0.21-cm$^2$ solar cell of Design A and an evaporated silver front grid were tested at the National Renewable Energy Laboratory (NREL). The certified current-voltage and external quantum efficiency (EQE) characteristics are shown in FIG. 13A and indicate efficiency of 14.66%+/−1.4%. Although the Voc of this particular device is slightly under 1 V (at 0.9954 V+/−0.3%), another device of Design B had a certified Voc of 1.0542 V+/−0.5%, which is approximately 150 mV greater than the long-standing record known in related art, and nearly 40 mV greater than the recently demonstrated 1V devices.

Figure 14A:
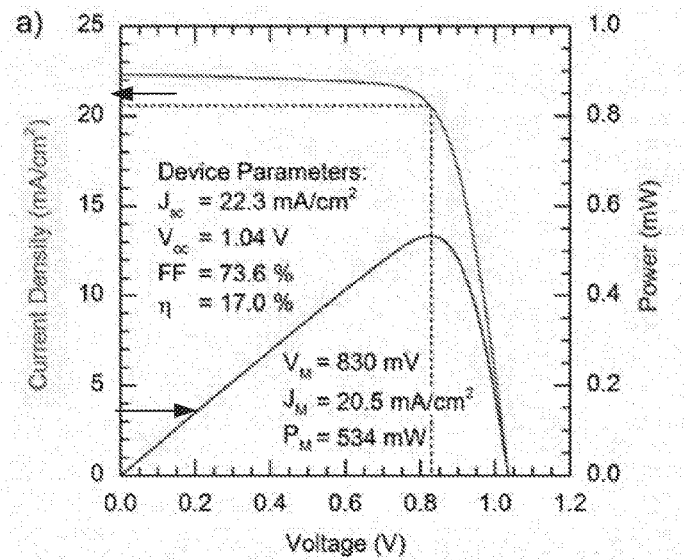
FIGS. 14A, 14B. 14C illustrate the optimum device performance.
Figure 14B:
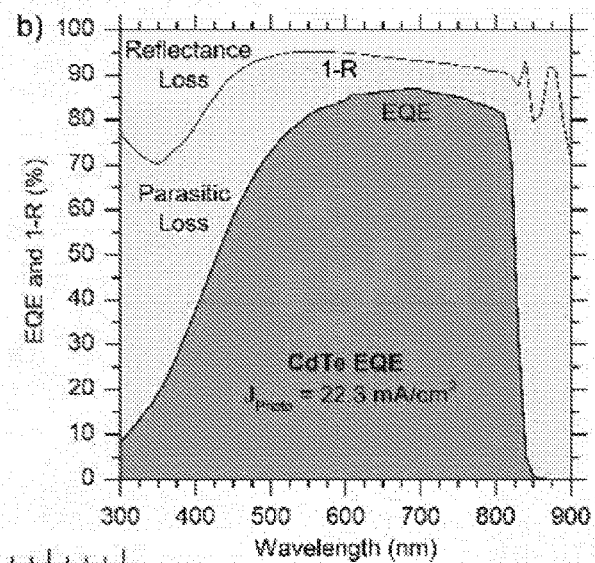
Figure 14C:
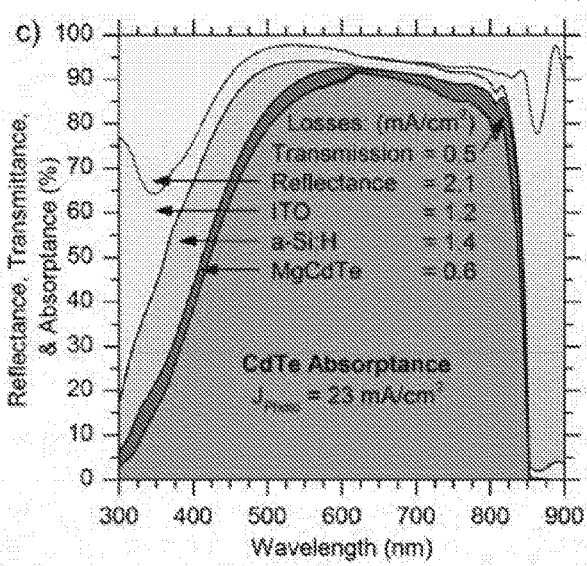
FIG. 14C: Simulated absorptance spectrum for the highest-performing CdTe solar cell device with a calculated photo-current of 23 mA/cm$^2$. The device under test (Design B) has a 10-nm-thick Mg$_{0.30}$Cd$_{0.70}$Te barrier layer, an 8-nm-thick a-Si:H hole-contact layer and an area of 0.03 cm$^2$.

Measurements of further devices with set-ups calibrated using the device measured by NREL revealed that many devices of Design A have demonstrated Voc consistently over 1V without sacrificing the output power under operating conditions, and the best tested device (Design B) had a Voc of 1.036 V, a Jsc of 22.3 mA*cm$^{-2}$, a FF of 73.6%, and power conversion efficiency of 17.0%, as shown in FIG. 14A. The maximum Voc measured from all the tested devices was 1.096 V (which is approaching the theoretical limit of 1.17V for CdTe solar cells with an absorbing substrate). All these device characteristics are greater than the previously reported records of Voc (1.017V) and efficiency (15.2%) for monocrystalline CdTe. The significant increase in both Voc and conversion efficiency is attributed to the much improved bulk carrier lifetime and reduced IRV through the use of MgxCd1-xTe passivation/barrier layers, and the heavily doped a-Si:H or a-SiCy:H hole-contact layer. The Jsc values of both Design A and B are also higher than the previously reported, primarily owing to the higher quantum efficiencies at shorter wavelengths (below 600 nm), as seen in FIG. 14B. An AM1.5G-weighted integration of the EQE, shown in area marked "EQE", provides a Jsc of 22.3 mA*cm$^{-2}$. The gap between the EQE and (1-R) curves of FIG. 14B indicates residual loss, attributed to parasitic optical absorption in the ITO, highly defective a-SiCy:H. and MgxCd1-xTe layers, as well as loss on transmission. The breakdown of these different losses by their mechanisms and the simulated absorptance of this structure are shown in FIG. 14C. The ITO, a-Si:H and MgxCd1-xTe layers all absorb incident sunlight before it reaches the CdTe absorber, and are responsible for Jsc losses of 1.2 mA*cm$^{-2}$, 1.4 mA*cm$^{-2}$ and 0.6 mA*cm$^{-2}$, respectively. Using a thinner hole contact layer or a wider-bandgap material can facilitate the reduction of the parasitic optical absorption at these levels of energies, resulting in additional current generation of over 3 mA*cm$^{-2}$.

External reflection also plays an important role in current loss within the device. By the very nature of the index matching between the ITO, a-Si:H and CdTe, the structure (with no initial concern given to reflectance) already exhibits relatively good anti-reflective properties, especially at 500 nm where near-complete absorption is observed. The use of multilayer anti-reflection coatings (for example, the one based on silicon dioxide and/or magnesium fluoride) can help regain some of this loss. As these are wafer-based devices, inevitably, a small portion of light is lost to transmission into the substrate. Simulated transmission loss for this structure amounts to 0.5 mA*cm$^{-2}$, but can be improved further through the use of a thicker absorber.

This example provided evidence that CdTe is an excellent material for solar cells and other optoelectronics applications by demonstrating material quality record well beyond previously known limits. The record minority carrier lifetime (3.6 microseconds), limited partially by radiative recombination, and IRV (as low as 1.2 cm s$^{-1}$) achieved in the CdTe/MgxCd1-xTe DHs configured according to the idea of the invention are comparable to or even better than the best values reported for GaAs/Al0.5Ga0.5As (18 cm s$^{-1}$) and GaAs/Ga0.5In0.5P (1.5 cm s$^{-1}$) DHs, and thus indicative of the potential for high Voc solar cell devices. The innovative approach for creating of a hole contact using a heavily doped a-Si:H or a-SiCy:H hole-contact layer in conjunction with the double-heterostructure design including a MgxCd1-xTe front passivation/barrier layer, allows for large values of Voc (resulting from the long carrier lifetime and low IRV) to be realized in functioning devices. MgxCd1-xTe/CdTe/Mg0.24Cd0.76Te DH based solar cells with the novel hole-contact layers (Design A) demonstrated Voc consistently over 1V (without greatly sacrificing the output power under operating conditions) and an NREL certified maximum measured e_ciency of 14.66%+/−1.4% with a Voc of 0.9954 V+/−0.3%. The maximum certified Voc of a device with similar layer structure design (Design B) is 1.0542 V+/−0.5%. It is worth noting that the use of the double-heterostructure design enabled a much broader choice of contact-layer materials with various degrees of perfection (crystalline or amorphous) for both types, p-type in particular for the CdTe case, and maintained the high performance of the solar cell without being compromised, as the minority carriers in the CdTe absorber are confined by the barriers. The combination of the double-heterostructure design and the amorphous hole-contact layer, according to the idea of the invention, offers an alternative way to circumvent the major challenge of p-type doping, and opens the door to many novel device structure designs, such as those utilizing ZnTe, MoOx, or CuZnS for the hole-contact layers. These results achieved with monocrystalline CdTe/MgCdTe double-heterostructures establish possibly achievable metrics for polycrystalline CdTe thin-film solar cells, should the presented approach be transferred to such technologies.

Example 4

Solar Cells Based on Monocrystalline CdTe/MCdTe DHs with ZnTe Hole Contacts

Just like in the previous Example, one of the primary differentiations between the structure discussed here and those of other CdTe devices is the use of an n-type absorber. With n-CdS/p-CdTe processes dominating industrial output, most research work has followed suit and focused on understanding and improving the limitations associated with p-type CdTe in order to improve commercial technologies without dramatically affecting the process. However, a great deal of these issues revolve around compensation and the dramatic reduction in material quality, with even low p-type doping densities that can be resolved by merely adopting a different architecture that relies on an n-CdTe absorber. While considerable improvement has been made in increasing the lifetimes in p-CdTe materials, the quality of associated barriers will still suffer, such as the use of p-ZnTe:Cu as a hole contact. Utilizing a monocrystalline n-type absorber opens up the possibility for much higher quality n-MgCdTe barrier layers and interfaces.

Figure 15:
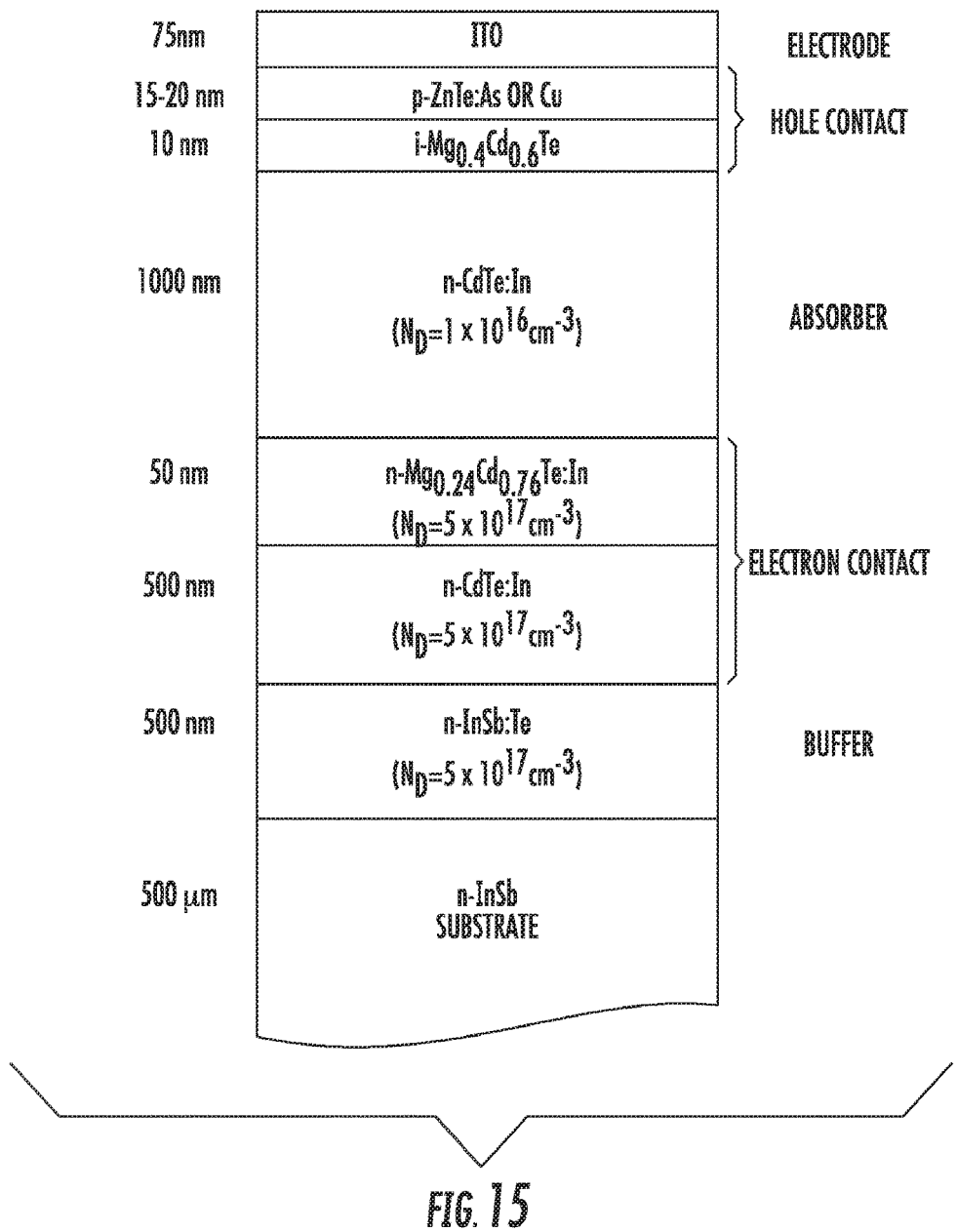
FIG. 15 shows schematically a layer structure of the CdTe/MgCdTe DH solar cell with a p-type ZnTe contact layer.

FIG. 15 illustrates the structure of the solar cells fabricated using this architecture. P—ZnTe was selected as the hole contact layer. An i-MgCdTe layer provides surface passivation and carrier confinement at the top of the absorber; an n-MgCdTe and n-CdTe layer stack offers the same functionalities at the bottom as an electron contact. The isolation of the absorber from the hole contact layer means that the quality of the contact layer is largely irrelevant; the design can accommodate defective layers, as was done with the work utilizing a-Si:H, but does not necessitate them, as single-crystal ZnTe functions here as well. Two different approaches were taken to produce a heavily doped ZnTe hole contact. While the overall design shown in FIG. 15 is the same in both cases, the deposition method and doping species for the contact layer differ. The ZnTe hole contact was doped with arsenic in one case and copper in another. In both cases, the cell—up to and including the i-MgCdTe layer—was first grown on a 2-in n-type InSb substrate in a VG V80H dual-chamber molecular beam epitaxy (MBE). The InSb buffer layer was grown in a dedicated III-V chamber after thermal desorption of the substrate's oxide at a substrate temperature of 390° C. and a Sb/In flux ratio of 1.5. After transferring the wafer to a dedicated II-VI growth chamber, all subsequent CdTe material growth was carried out at a substrate temperature of 265 OC and a Cd/Te flux ratio of 1.5.

In the case of arsenic doping, the top 20-nm-thick p-ZnTe layer was then grown in a custom metal-organic chemical vapor deposition (MOCVD) system at 300° C. The samples were then shipped back to ASU for further processing and characterization. The growth conditions have been shown, through Hall measurements, to produce p-type ZnTe films with carrier concentrations of $2 \times 10^{18}$ cm$^{-3}$. In the case of copper doping, the cell was fully grown by MBE, including a 15-nm-thick ZnTe contact layer. This layer was deposited nominally intrinsic. A 1-nm-thick layer of copper was then sputtered on this layer, where it then diffused into the ZnTe. Hall measurements on ZnTe films doped in this manner indicated an average concentration of $4 \times 10^{18}$ cm$^{-3}$, while CV measurements on the same samples indicated an average concentration of $6 \times 10^{18}$ cm$^{-3}$. Further processing, such as indium tin oxide (ITO) and silver contact deposition were carried out in a similar manner for both hole contact designs discussed here.

For all devices under test, the final processing steps includes the sputtering of circular ITO patches of 2- and 3-mm diameters. While the ITO can be probed directly, silver contact pads were subsequently sputtered on the edges of the patches to ensure consistent long-term ohmic contacts.

Figure 16:
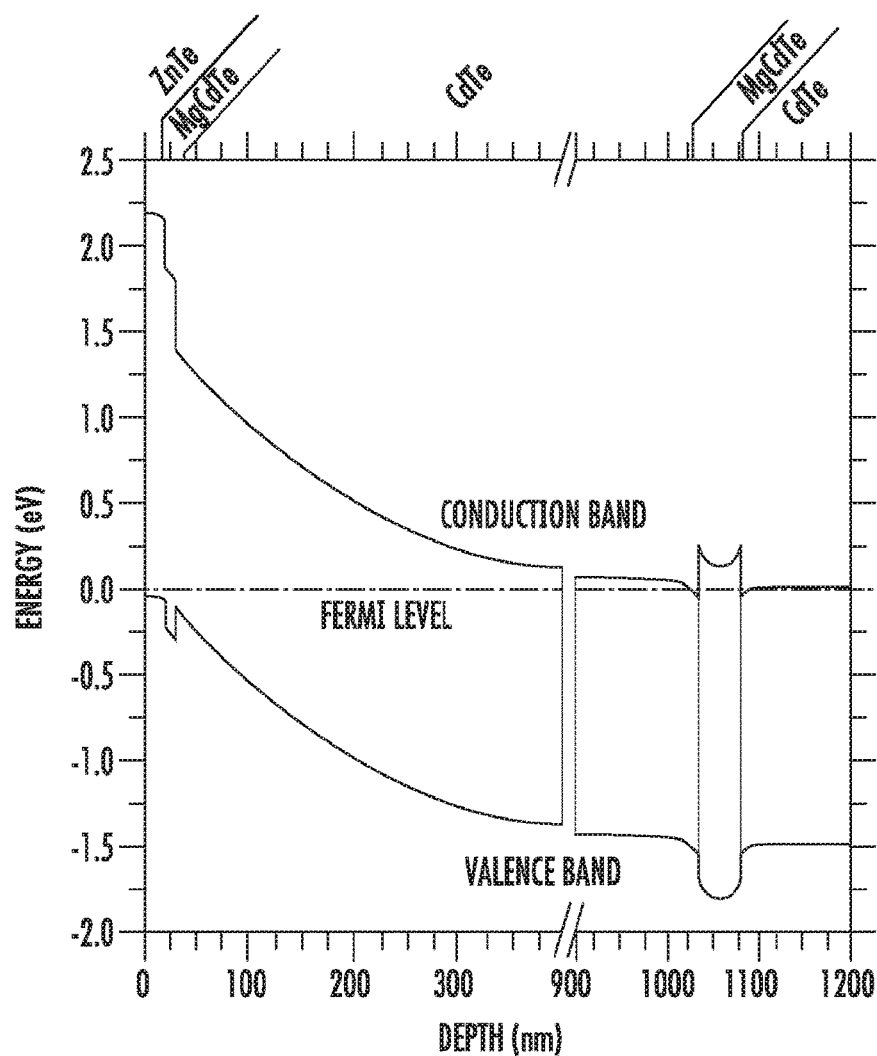
FIG. 16 illustrates a simulated band-edge diagram at equilibrium for a cell of FIG. 15.

FIG. 16 depicts the calculated band-edge diagram at equilibrium for the device structure shown in FIG. 15 with arsenic-doped ZnTe (ZnTe:As). Significant indium diffusion from the InSb buffer and substrate is present in the CdTe absorber, as discussed below. With indium acting as the n-type dopant throughout the CdTe layers, the diffusion resulted in an increase in the doping density at the back surface of the absorber layer—this is reflected in the band-edge diagram simulations. A complete list of the parameters used in the band-edge diagram simulations is shown in the table of FIG. 17; the same parameters listed for the n-CdTe absorber were used for the CdTe electron contact except for the thickness, which was 500 nm, and the doping density, which was $5 \times 10^{17}$ cm$^{-3}$.

Quality of Absorber Material.

Figure 18:
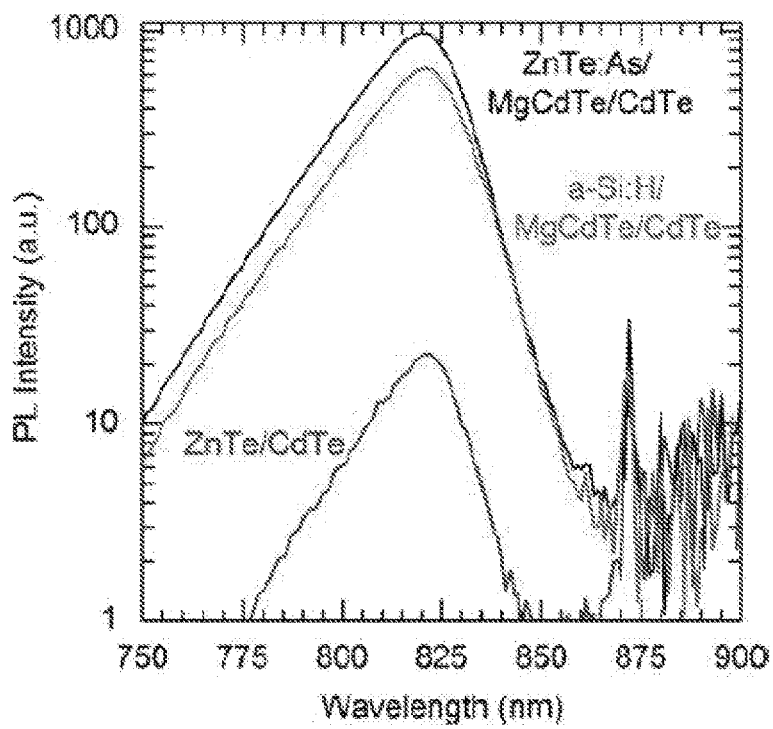
FIG. 18 presents plots of steady-state PL intensity for three device structures utilizing a monocrystalline CdTe absorber with a p-ZnTe contact layer but without a Mg$_x$Cd$_{1-c}$Te barrier, an a-Si:H contact layer with a 10-nm-thick i-Mg$_{0.30}$Cd$_{0.70}$Te barrier layer, or a p-ZnTe contact layer with a 10-nm-thick i-Mg$_{0.30}$Cd$_{0.70}$Te barrier layer.
Figure 19:
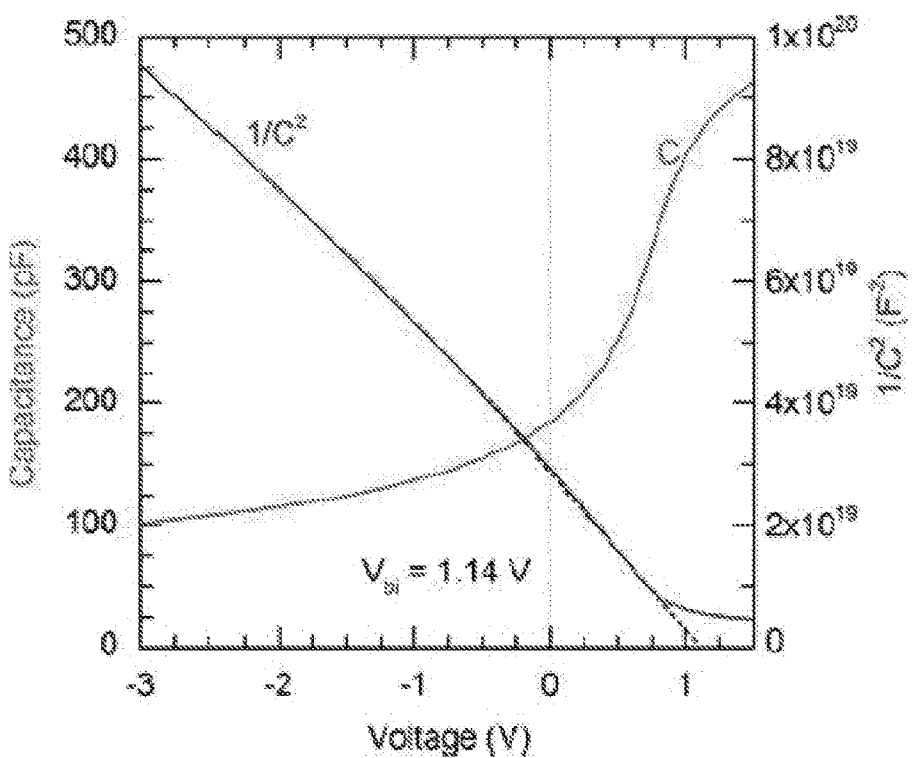
FIG. 19 presents C-V and 1/C$^2$ profiles for a solar cell with a copper-doped ZnTe hole contact. The measurement was taken using a Hg probe prior to ITO deposition.

FIG. 18 illustrates the steady-state PL intensity of complete solar cell devices, which is a good measure of both the quality of the material and an indicator of the maximum quasi-Fermi-level separation in the absorber. Prior device construction included a p-ZnTe/n-CdTe heterojunction at the surface of the absorber. Due to the large lattice mismatch between these materials in addition to the growth interruption, this interface has a very large interface recombination velocity (IRV), and thus, the PL intensity of devices with this construction suffers, as seen from the blue ("1 A Cu") curve in FIG. 18. As the CdTe/MgCdTe heterointerface is much better suited to minimize the IRV, double heterostructures constructed using this system have a much higher effective minority carrier lifetime and, therefore, produce a much higher PL intensity. The red and black (respectively, "No Cu" and "10 A Cu") curves plotted in FIG. 18 are both from solar cell structures containing an i-MgCdTe passivation layer. In both cases, the PL intensity is nearly an order of magnitude stronger than that of the structure without a passivation layer. It is understandable that the PL for these samples is similar, as they are both constructed of the same underlying double-heterostructure design. A very small value of the difference between the two is indicative of the fact that the individual contact deposition processes do little to damage, or negatively affect, the quality of the absorber layer itself. Compared with the largest measured Voc of 759 mV for devices without a passivation layer, we expect a much larger value with these samples. Indeed, the cell with the a-Si:H hole contact in FIG. 18 resulted in a Voc of 0.9954 V±0.3%, and similar PL intensity is obtained for a-Si:H and ZnTe hole contacts on top of the i-MgCdTe passivation layer—further evidence that the quality of the absorber is unaffected by the contact choice. C-V measurements on the ZnTe/MgCdTe/CdTe double-heterostructure solar cells made in this study, shown in FIG. 19, indicate a built-in voltage of 1.14 V, thus demonstrating a potential to reach a similarly high Voc.

Effect of Copper Doping on Absorber in the Case of Copper Doping, the Copper can migrate into the CdTe absorber, and while it is employed as a p-type dopant in typical processes, it is a deep-level acceptor with extremely poor incorporation.

With an n-type absorber, incorporated or not, the presence of copper will lead to a reduction in performance either through dopant compensation or an addition of recombination centers. Lifetime and overall PL intensity have been shown to be dramatically reduced with an excess of copper. Preventing this migration is essential to maintain the high quality and long carrier lifetime in the absorber.

Figure 20:
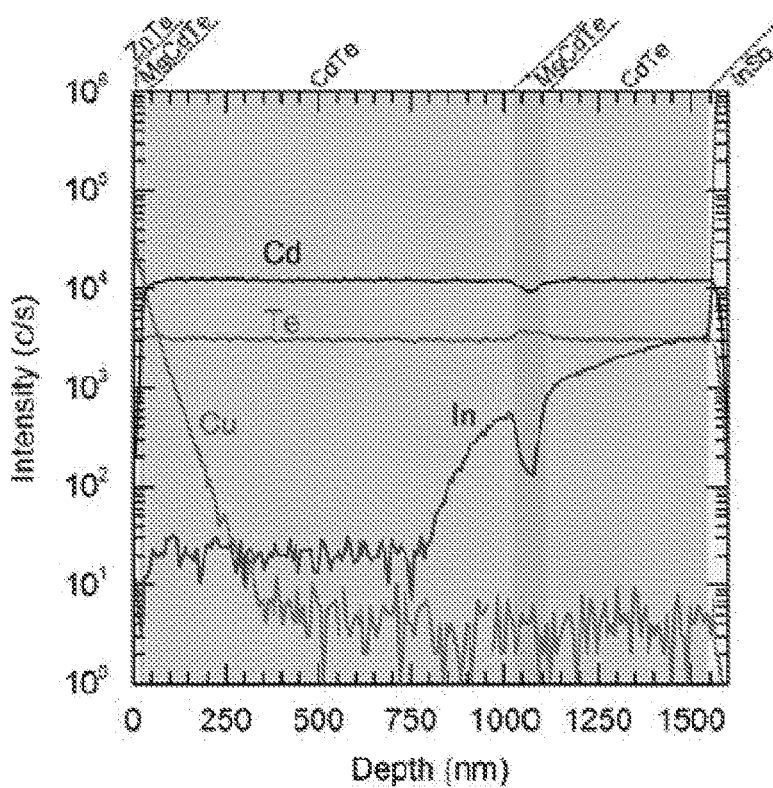
FIG. 20 shows a SIMS profile of a solar cell with a Cu-doped ZnTe hole contact. The profile was measured with a primary current of 100 nA with a raster of 250 µm and a field aperture in place, thereby limiting the sampling area to 60 µm$^2$ in the center.

Yet, the SIMS profile in FIG. 20 shows just such an undesirable occurrence. Copper has migrated, from the surface, several hundred nanometers into the CdTe absorber. It is worth noting that significant In diffusion from the substrate, and subsequent buffer layer, is present at the back side of the device and can be seen to increase the doping in the bottom 250 nm of the absorber.

While annealing after copper deposition is not necessary to achieve copper activation in the ZnTe, additional processing steps, as well as operating conditions, can expose the cell to temperatures that may affect the migration of the copper. The SIMS profile was taken on a solar cell with no annealing and already shows copper within the absorber, as the copper seed layer is not removed during processing, annealing can only increase the density and depth of the copper in the absorber. Using the PL quantum efficiency as an indicator of the implied Voc, significant degradation is seen as annealing moves additional copper into the absorber. Annealing was carried out in standard atmospheric conditions for a period of 30 s at each temperature.

Figure 21:
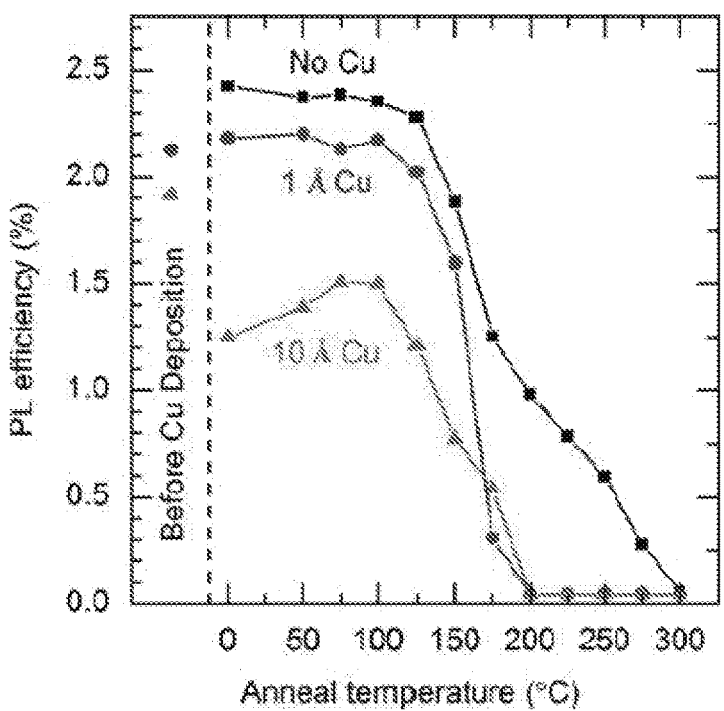
FIG. 21 contains plots of PL quantum efficiency versus anneal temperature for samples with 1 Å of copper and 10 Å of copper on the surface of the ZnTe contact layer compared with a control sample with no copper deposition.

As can be seen in FIG. 21, even before annealing, 10 A of copper leads to a reduction in PL. As the annealing temperature nears 150° C., the PL begins to crater with a complete loss of performance and zero PL intensity at only 200° C., while the control sample takes longer to decay. Reducing the thickness of the copper material at the surface protects, to some extent, the integrity of the absorber with little to no annealing, but is still detrimental when exposed to temperatures beyond 100° C.

Figure 22:
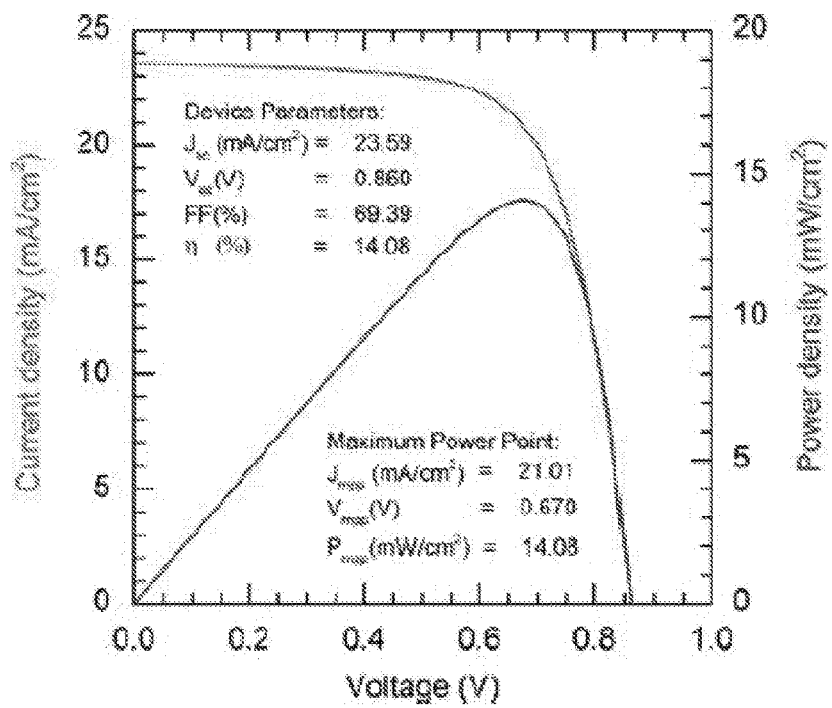
FIG. 22 presents Light J-V curve and power density for a CdTe double-heterostructure solar cell with a ZnTe:As hole contact. This curve represents an active-area efficiency corrected using the integrated EQE.
Figure 23:
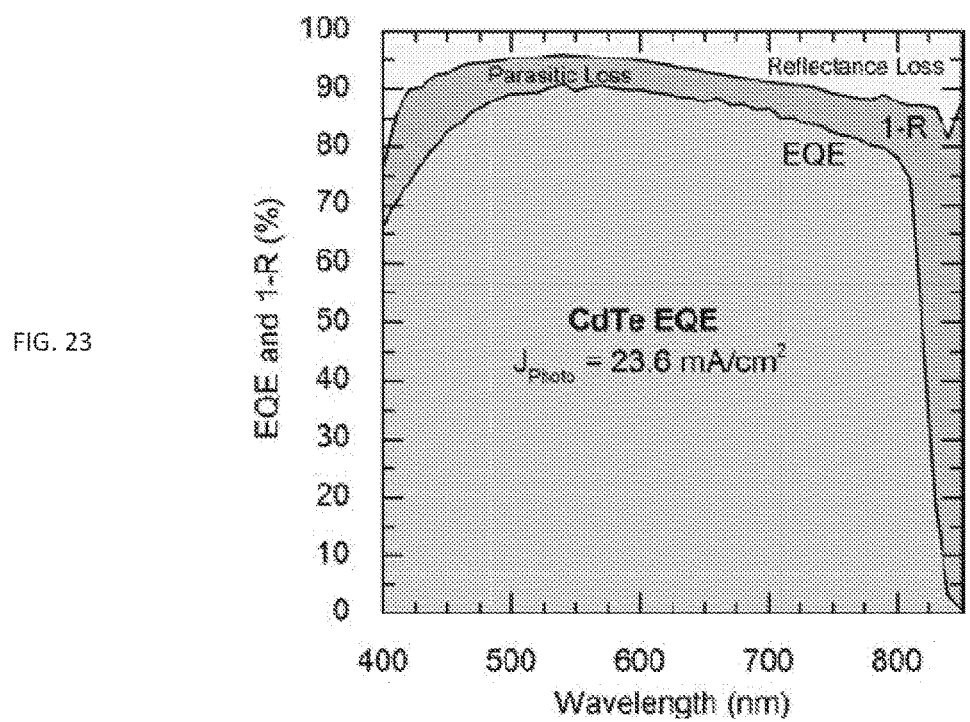
FIG. 23 provides EQE and (1-R) characteristics for the highest performing solar cell with a ZnTe:As hole contact. This device was processed and characterized without the use of an additional antireflection coating.
Figure 24:
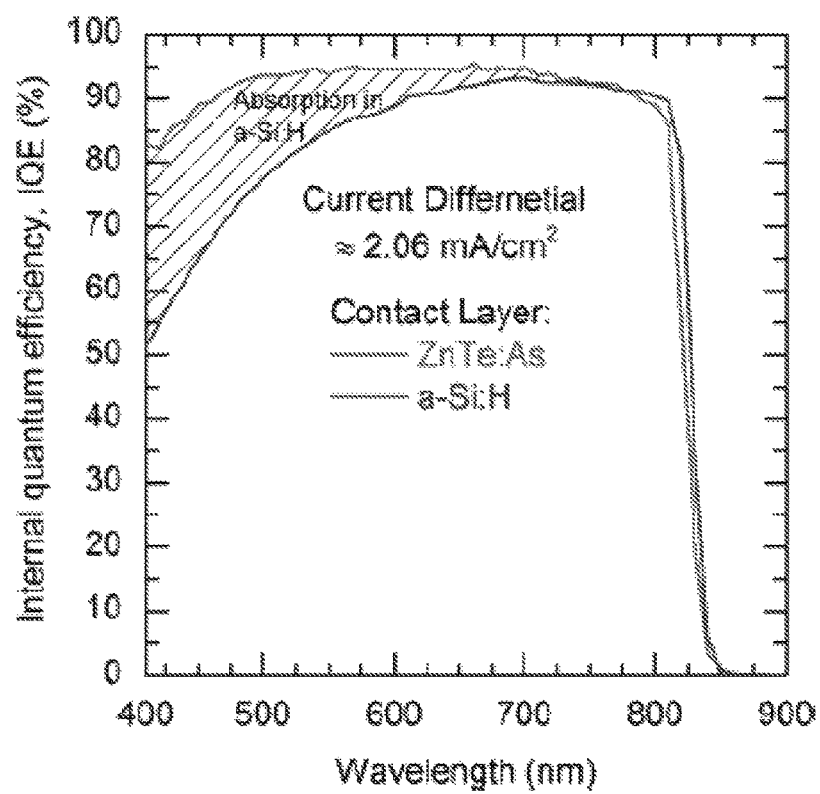
FIG. 24 shows IQE of CdTe solar cells with two different hole contacts: ZnTe:As and a-Si:H. The listed current differential is found by weighting the area between the curves by the AM1.5G spectrum and integrating.

Device Characterization $V_{OC}$ and power conversion efficiency (ii) are compared in FIG. 25 for several device structures, each with a different hole contact. The introduction of the MgCdTe barrier clearly results in an improvement in Voc, no matter the hole contact used. The arsenic-doped ZnTe hole contact provides a higher Voc and efficiency than that of the copper-doped contact (ZnTe:Cu), with copper diffusion being a potential cause. The current density-voltage (J-V) curve for the highest efficiency ZnTe:As-based device is shown in FIG. 22 with the external quantum efficiency (EQE) and reflectance shown in FIG. 23. Devices are isolated using an aperture comprised of a 100-μm silicon wafer with laser-cut windows. Circular holes with areas of 0.033 and 0.074 cm$^2$ are used to accurately define the area of each device. ZnTe was chosen because of its ability to achieve high hole concentrations inducing high built-in voltages, but of similar importance is the wide bandgap of ZnTe, which allows for less parasitic absorption when compared with other amorphous or poly-crystalline hole contacts, such as a-Si:H. The internal quantum efficiencies (IQEs) of two device designs are shown in FIG. 24. With the use of ZnTe:As as the hole contact, parasitic absorption at shorter wavelengths (<600 nm) is minimized. The difference in IQE corresponds to a 2.1 mA/cm$^2$ gain of potential photogenerated current when using ZnTe instead of a-Si:H. This represents nearly 7% of the maximum short-circuit current density (Jsc) attainable for a bandgap of 1.5 eV.

The copper-doped ZnTe hole contact shows the same improvements in quantum efficiency at shorter wavelengths and consequently demonstrates similar improvements in current. This large current differential taken from the IQE is not necessarily born out in the current comparison between the highest performance devices shown in FIG. 25, as the ZnTebased devices will have a significantly different reflectance than that of the a-Si:H-based devices. A proper comparison of the final currents would need to be made after each device has an optimized antireflection coating.

Overall, monocrystalline p-ZnTe/i-MgCdTe/n-CdTe/n-MgCdTe double-heterostructure solar cells were grown in a process combining MBE and MOCVD deposition techniques, negating the effect of the ZnTe/CdTe heterointerface through the use of a MgCdTe passivation and barrier layer. The stead-state PL intensity and built-in voltage results suggest that the CdTe/MgCdTe double-heterostructure solar cells with a ZnTe hole contact layer have the potential to achieve a high implied Voc. It was shown, however, that extracting such voltage at the electrodes is not trivial. The Voc of the solar cell devices with a ZnTe:Cu and ZnTe:As hole contact were 819 and 867 mV, respectively. Yet, the use of ZnTe as the top hole contact layer improves the EQE at wavelengths below 600 nm, thereby dramatically increasing the Jsc of such devices by over 2 mA/cm$^2$ as compared with devices using an a-Si:H hole contact. The resulting maximum efficiency of 14.1% was demonstrated with an arsenic-doped ZnTe hole contact grown by MOCVD.

Example 5

In an embodiment related to that of Example 3 and configured according to the structure of FIG. 10A, a monocrystalline CdTe/MgCdTe double-heterostructure solar cell with an a-Si:H hole contact and an ITO/SiO$_x$ electrode stack was manufactured, in which a maximum total-area efficiency of 18.5% and active-area efficiency of 20.3% measured under AM1.5G illumination was achieved. Additional cells have been measured with open-circuit voltages of up to 1.12 V while still maintaining high fill factors and no rollover, either before or after open circuit, confirming the potential of this approach to reach very high efficiencies. The optical losses within the device were quantified and analyzed across the spectrum to determine there exists potential for increased current generation through a reduction in parasitic absorption in the contact layer or by reducing the absorber bandgap through the incorporation of selenium. Fitting the current-voltage characteristic revealed the leading cause of the less-than-ideal fill factors is series resistance, which contributed to a 7% absolute loss.

Table IV lists the maximum measured parameters of devices formed from the same wafer. In all cases, the Voc is about 1 V while the FF is over 70%. The maximum unshaded area efficiency of 20.3% was measured on a cell with considerable metal coverage, thereby explaining the large difference between the current densities of the total area and the unshaded area.

TABLE IV

| $V_{oc}$ (V) | $J_{sc}$ (mA/cm$^2$) | | FF (%) | Efficiency (%) | |
|---|---|---|---|---|---|
| | Total area | Unshaded area | | Total area | Unshaded area |
| 1.11 | 21.1 | | 72.22 | 16.88 | — |
| 1.09 | 22.6 | | 73.97 | 18.17 | — |
| 1.10 | 21.6 | | 75.86 | 17.96 | — |
| 1.09 | 22.4 | | 75.71 | 18.52 | — |
| 1.10 | 18.7 | 24.5 | 75.57 | 15.49 | 20.3 |

The J-V curve of the best total-area device was fitted with a 1-diode model based on the model developed by Merten et al. (see IEEE Trans. Electron. Devices, v. 45, no. 2, pp. 423-429, 1998). The parameters used in the model are listed in Table V. The last three rows represent FF loss mechanisms, and the respective improvements expected from removing each loss is listed in the last column of the table. The slight slope around short-circuit conditions can be well fit with a parallel resistance of only 5 k$\Omega$·cm$^2$, indicative of slight shunting responsible for a 0.6% FF loss. Yet, to properly reproduce the shape of the J-V curve between −1V and maximum-power-point (MPP), an additional imperfect collection term has to be used, which we model with a mobility lifetime product of 3.3 10$^6$ cm$^2$/V, responsible for another 1.3% FF loss. Though such a mobility-lifetime product might be unrealistic in view of the microsecond-range lifetime observed in these samples, the convex shape of the J-V curve between −1V and MPP is characteristic of a collection issue and not of shunting (neither Ohmic nor non-Ohmic). Such a collection issue was also observed from a poorer FF when thickening the absorber layer above 1 µm, and its origin is subject to further studies. The series resistance amounts to the largest of the loss mechanisms, and an over 7% (absolute) improvement in FF is expected if the resistance can be reduced. About 1% can be attributed to metallization (sheet resistance of the front ITO, and resistive losses in the finger and contact resistance). The origin of the remaining 6% loss is currently under investigation, and is to be sought after in the numerous barriers to charge extraction between the CdTe absorber and the electrodes.

TABLE V

Modeled device parameters

| | Value | Unit | Absolute FF loss |
|---|---|---|---|
| diode saturation current ($J_0$) | 7.7 10$^{-13}$ | mA/cm$^2$ | |
| diode ideality factor (n) | 1.4 | — | |
| photogenerated current ($J_{ph}$) | 22.6 | mA/cm$^2$ | |
| effective mobility · lifetime product ($\mu \cdot \tau$)$_{eff}$ | 3.3 10$^{-6}$ | cm$^2$/V | 1.3% |
| parallel resistance ($R_p$) | 5000 | $\Omega \cdot$ cm$^2$ | 0.6% |
| series resistance ($R_s$) | 4 | $\Omega \cdot$ cm$^2$ | 7.1% |

Example 6

Crystalline silicon is the most successfully commercialized photovoltaic technologies taking up 90% of the market share. The record efficiency of 25.6% is approaching its practical efficiency limit, and further efficiency improvement is more and more challenging. Achieving higher efficiencies is critical to lowering the cost of electricity generated by photovoltaic (PV) systems, because cell encapsulation cost and balance of system (BOS) cost are the largest cost contributors and these costs are proportional to the area of solar cell modules.

The following embodiment demonstrated monocrystalline Mg$_{0.13}$Cd$_{0.87}$Te solar cell (built around the MgCdTe DH of the invention) with a bandgap of 1.7 eV, an open-circuit voltage of 1.176 V, and an efficiency of 11.2% under one-sun AM1.5G spectrum. According to an idea of the invention, combining an efficient poly-crystalline 1.7 eV thin-film II-VI semiconductor top cell with a 1.1 eV silicon bottom subcell would facilitate a practical and low-cost pathway to a solar-cell device efficiency approaching 30%.

Growth and Characterization.

Figure 26:
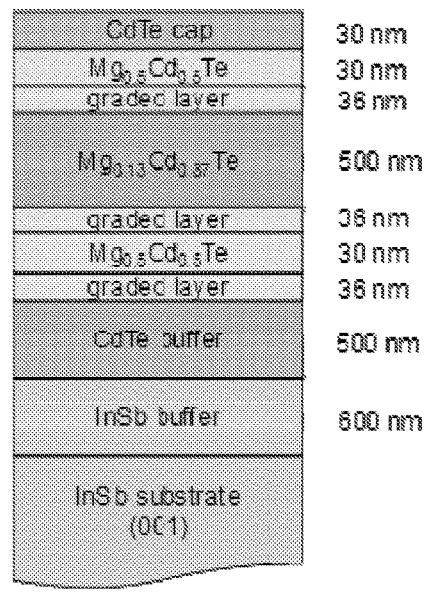
FIG. 26 presents a schematic diagram of a Mg$_{0.13}$Cd$_{0.87}$Te/Mg$_{0.5}$Cd$_{0.5}$Te DH sample.

The Mg$_{0.13}$Cd$_{0.87}$Te/Mg$_{0.5}$Cd$_{0.5}$Te DHs were grown using MBE on lattice matched InSb (001) substrate. The detailed growth method and conditions are similar to those reported by DiNezza et al. in Appl. Phys. Lett. 103, 193901, 2013 (which is incorporated herein by reference). A schematic structure is shown in FIG. 26, in which a barrier layer is spatially graded in that one certain portion of such graded layer has one level of doping material contained in it, while another certain portion has another level of the doping material. Differently doped portions of the graded layer are in contact with one another and spatially complementary to one another such that, aggregately, they form the overall graded layer. In particular, the content of Mg in the barrier layer varies spatially to result in a barrier layer with graded potentials. The Mg$_{0.5}$Cd$_{0.5}$Te is the barrier layer for the 1.7 eV bandgap Mg$_{0.13}$Cd$_{0.87}$Te absorber.

Figure 27A:
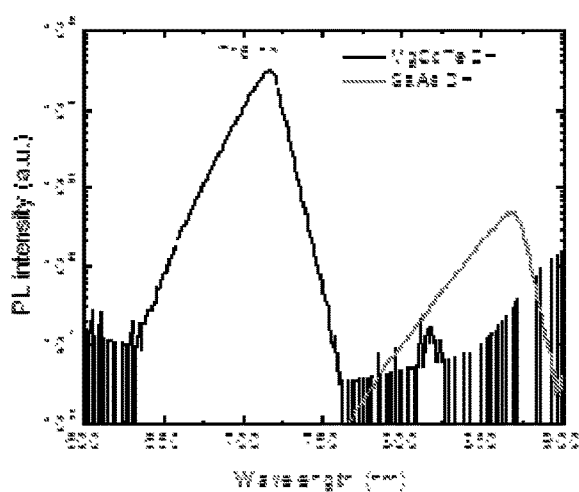
FIGS. 27A, 27B illustrate results of photoluminescence test (FIG. 27A) and time-resolved photoluminescence test of the DN sample of FIG. 26.
Figure 27B:
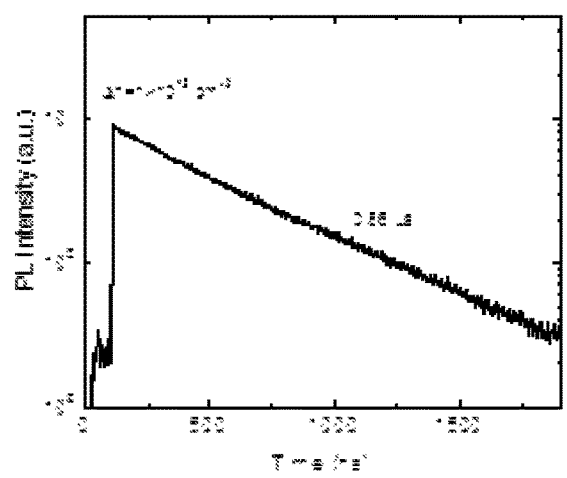

PL and TRPL measurements were carried out to evaluate the optical properties of the Mg$_{0.13}$Cd$_{0.87}$Te/Mg$_{0.5}$Cd$_{0.5}$Te DH. In FIG. 27A, the PL spectrum shows that the PL peak wavelength is at 716 nm which corresponds to a bandgap energy of 1.71 eV, considering the 1 kT difference between the bandgap energy and PL peak energy. The PL spectrum of a high quality GaAs/Al$_{0.25}$Ga$_{0.75}$As DH is also shown for comparison indicating that the PL intensity of Mg$_{0.13}$Cd$_{0.87}$Te/Mg$_{0.5}$Cd$_{0.5}$Te DH is very high. FIG. 27B shows that the sample has a very long carrier lifetime of 0.56 µs. The strong PL intensity and long carrier lifetime indicate that the material quality both for the Mg$_{0.13}$Cd$_{0.87}$Te bulk region and at the Mg$_{0.13}$Cd$_{0.87}$Te/Mg$_{0.5}$Cd$_{0.5}$Te interfaces are very high.

Figure 28:
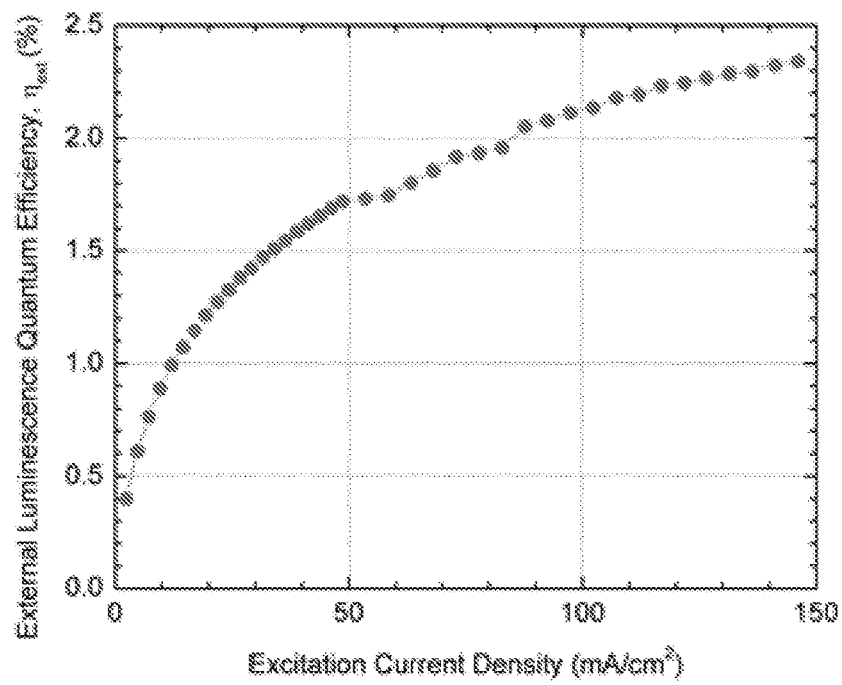
FIG. 28 is a plot of external luminescence quantum efficiency ($\eta_{ext}$), for ample of FIG. 26, presented as a function of excitation current density.

External luminescence quantum efficiency ($\eta_{ext}$), see Eq. (7), is shown as a function of excitation current density in FIG. 28. Here, $V_{db}$ is the detailed-balance open circuit voltage, and it is calculated to be 1.4 V for the DH of FIG. 26. $\eta_{ext}$ is 1.2% under one-sun condition, i.e. a carrier injection current density of approximately 20 mA/cm$^2$. The implied open-circuit voltage is 1.3 V according to Eq. (7).

Solar Cell Structure and Device Performance.

Figure 29A:
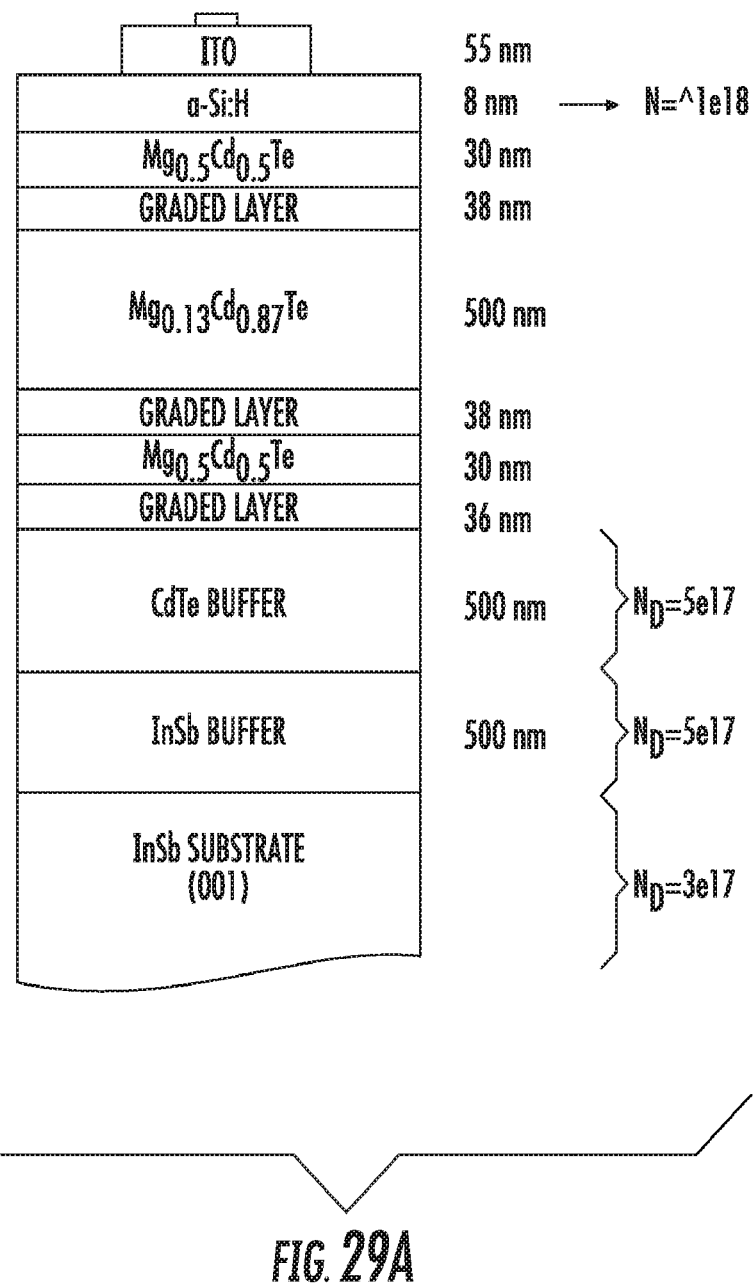
FIGS. 29A, 29B illustrate a solar cell layer device, configured based on the structure of FIG. 26, and the corresponding band-diagram at equilibrium, respectively.
Figure 29B:
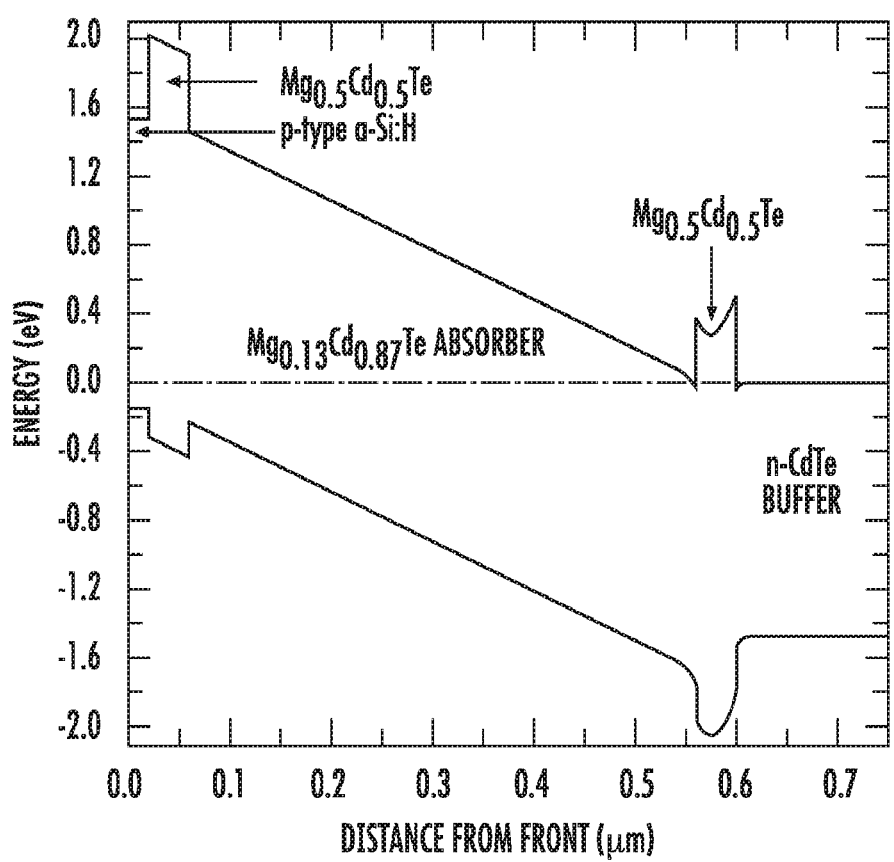

The cell structure, shown in FIG. 29A, includes an MBE grown Mg$_{0.13}$Cd$_{0.87}$Te/Mg$_{0.5}$Cd$_{0.5}$Te DH on an InSb substrate, a PECVD (Plasma-enhanced chemical vapor deposition) deposited p-type hydrogenated amorphous silicon (a-Si:H) contact layer, and an Indium Tin Oxide (ITO) top electrode. The n-type dopant for CdTe is indium and p-type dopant is for a-Si:H boron. Indium may diffuse from the InSb and CdTe buffer to the Mg$_{0.5}$Cd$_{0.5}$Te bottom barrier layer, facilitating the electron transport. The Mg$_{0.13}$Cd$_{0.87}$Te active region were unintentionally doped, because it was found that unintentionally doped sample has the strongest PL intensity. Shown in FIG. 29B, is the equilibrium state band edge alignment. The conduction and valance band offset ratio between CdTe and MgTe is assumed to be 70:30. The p-type a-Si:H layer on top of the DH induces band-bending in the $Mg_{0.13}Cd_{0.87}Te$ absorber. The small valance band offset at the front $Mg_{0.13}Cd_{0.87}Te/Mg_{0.5}Cd_{0.5}Te$ interface allows holes to be selectively extracted out of the $Mg_{0.13}Cd_{0.87}Te$ absorber region during the operation of the solar cell, while the large conduction band offset prevent electrons from going to the p-type contact region.

The ITO and InSb layers are not drawn in the band-diagram. According to the literature, the carrier transport between ITO and p-type a-Si:H is through tunneling. The InSb substrate, having a narrow bandgap of 0.17 eV, is conductive and the resistance at the CdTe/InSb interface is negligible.

The p-type a-Si:H covers the entire sample, while the 55-nm-thick ITO are deposited in small patches on top of the a-Si:H layer. The conductivity of the p-type a-Si:H is low, thus the cell area is defined by the conductive ITO, which has a sheet resistance of 100 Ω/sq. The ITO layer also plays a role as anti-reflection coating. During the light-JV and External Quantum Efficiency (EQE) measurements, the wafers are mounted onto a gold coated Si substrate and the measurements are done by probing silver metal contacts on top of the ITO patches and the gold Si substrate. The results are shown in FIGS. 30A, 30B. $J_{sc}$ could not be accurately determined from light-JV measurement, since the cell areas were not particularly well defined by the ITO patches (carriers generated from around the cells can contribute to the total current). Thus $J_{sc}$ is calculated by integrating the EQE curve with the AM1.5G spectrum and it is determined to be 15.0 mA/cm² for the solar cell measured. The directly measured JV curve is scaled to match the 15.0 mA/cm² $J_{sc}$ 11.2% is the active area efficiency and considering the ~10% metal coverage, the total area efficiency is 10.1%.

The $V_{oc}$ of 1.176 V is lower than the calculated implied $V_{oc}$ probably because the built-in voltage between p-type a-Si:H and n-type CdTe is not high enough. It is also possible that the bottom barrier layer ($Mg_{0.5}Cd_{0.5}Te$) is not ideal for the transport of majority carriers (electrons), which could decrease the output voltage of the solar cell. The low Fill Factor (FF) of 63.5%, also implies that the charge transport in this solar cell structure still has a room for improvement.

Figure 31:
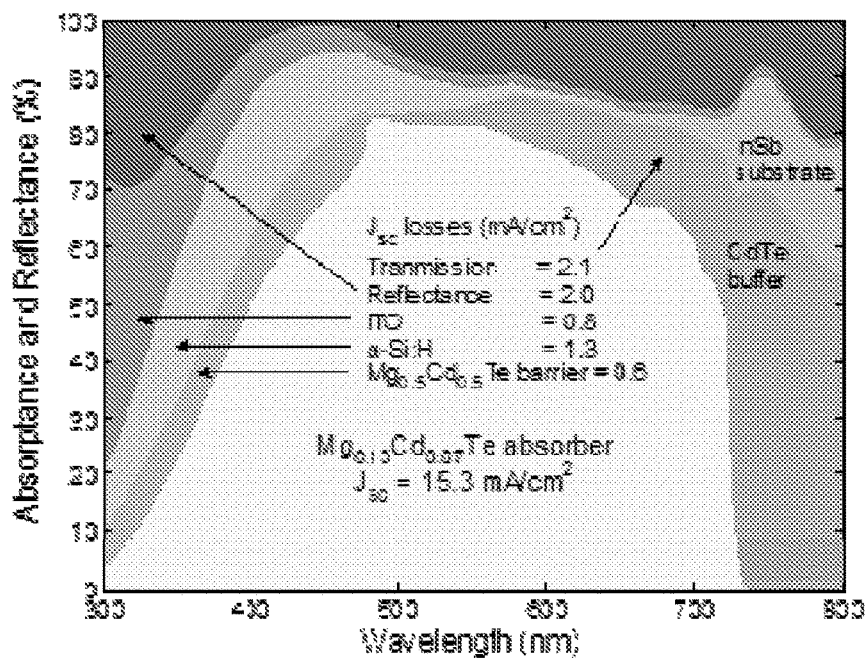
FIG. 31 includes plots showing calculated reflectance, transmittance, and absorptance spectra of Mg$_{0.13}$Cd$_{0.87}$Te/Mg$_{0.5}$Cd$_{0.5}$Te double-heterostructure solar cell of FIG. 29A.

To analyze the loss mechanisms of photocurrent, the reflectance and absorptance spectrum of each layer we calculated using wave-optic approach, as shown in FIG. 31. The absorptance of the $Mg_{0.3}Cd_{0.87}Te$ absorber layer resembles the measured EQE closely, indicating that the carrier collection efficiency in the solar cell is close to unity, which is expected since the minority carrier lifetime in $Mg_{0.13}Cd_{0.87}Te/Mg_{0.5}Cd_{0.5}Te$ DH is measured to be very long, indicating a long diffusion length. Integrating the absorptance of the CdTe absorber with the AM1.5 spectrum gives a $J_{sc}$ of 15.3 mA/cm². The losses of photocurrent due to reflectance and parasitic absorptions are also shown in FIG. 31. $J_{sc}$ can be further improved by minimizing the reflection and parasitic absorptions with, for example, employing double-layer antireflection coatings, wider-bandgap hole contact layers and a thicker $Mg_{0.13}Cd_{0.87}Te$ absorber. It is appreciated that, to obtain an efficiency gain in a tandem configuration with Si solar cell (having, for example, a 25.6% efficiency), the 1.7 eV $Mg_{0.13}Cd_{0.87}Te$ solar cell efficiency should be at least 13%.

Figure 32:
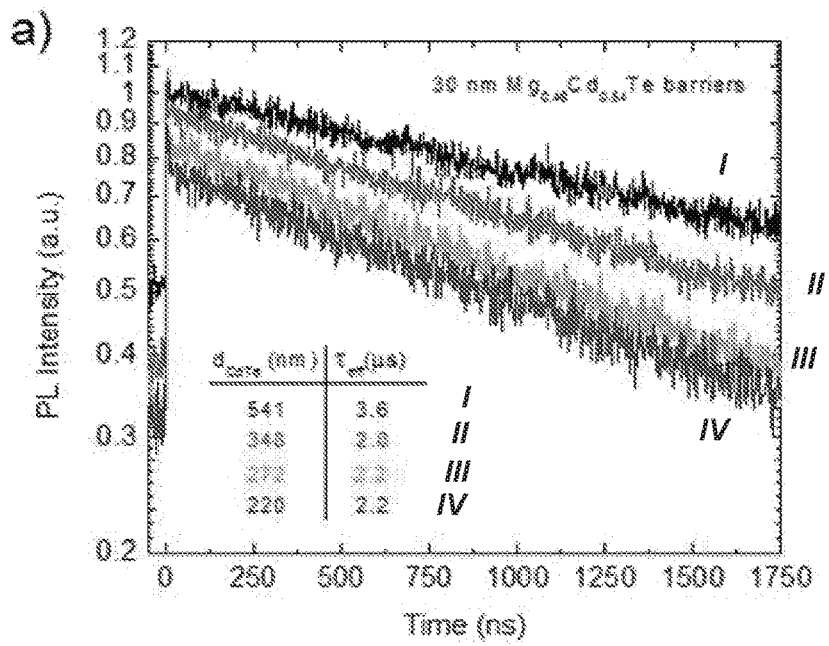
FIG. 32 contains plots of normalized room temperature time-resolved photoluminescence decay for a set of four DH samples. Each of the samples includes of two 30 nm Mg$_{0.4}$Cd$_{0.5}$Te barriers and a CdTe layer with a thickness between 220 nm to 541 nm. The plots have been shifted along y-axis apart for clarity.

From the above discussions and examples it is appreciated, therefore, that according to the idea of the invention, in order to reduce interface recombination velocity (IRV) in the proposed structures, a DH was employed in which a CdTe absorber layer is sandwiched between two $Mg_xCd_{1-x}Te$ barrier layers. These wide-bandgap barriers effectively confine the minority carriers to the narrower-bandgap CdTe absorber. Additionally, the $CdTe/Mg_xCd_{1-x}Te$ interfaces themselves are close to perfect, eliminating recombination-active defects at the absorber interfaces. FIG. 32 displays time-resolved photoluminescence (TRPL) data for a set of four $CdTe/Mg_xCd_{1-x}Te$ DH samples, each including two 30-nm-thick intrinsic $Mg_{0.46}Cd_{0.54}Te$ barriers, a CdTe middle layer with a n-type background doping of low $10^{14}$ cm⁻³, and a thickness between 220 nm to 541 nm-accurately determined by detailed analysis of high-resolution x-ray diffraction measurement results. All samples exhibit effective carrier lifetimes—determined by fitting single exponentials to the photoluminescence (PL) decay tails—exceeding 2 μs, which attests to the high quality of the CdTe layers and the $CdTe/Mg_xCd_{1-x}Te$ heterointerfaces. The longest lifetime of 3.6 ρs is substantially longer than the previous records for crystalline bulk and $CdTe/Mg_xCd_{1-x}Te$ DHs.

The interface recombination velocity can be parsed by varying the CdTe bulk layer thickness. The expression for effective (measured) lifetime $\tau_{eff}$ is shown in equation (1), where $\tau_{rad}$ and $\tau_{non}$ are the radiative and non-radiative lifetime, respectively. Radiative lifetime is related to the photon recycling factor γ (derived using the methodology discussed by M. Steiner (in *J. Appl. Phys.* 113, 123109, 2013)·material radiative recombination coefficient B, and the doping concentration $N_D$. Since the photon recycling effect is stronger for thicker samples, the radiative lifetime becomes longer for DH samples with thicker CdTe middle layers. The non-radiative lifetime is related to the bulk Shockley-Read-Hall (SRH) lifetime $\tau_{SRH}$ and the interface recombination, see Eq. (1).

Figure 33:
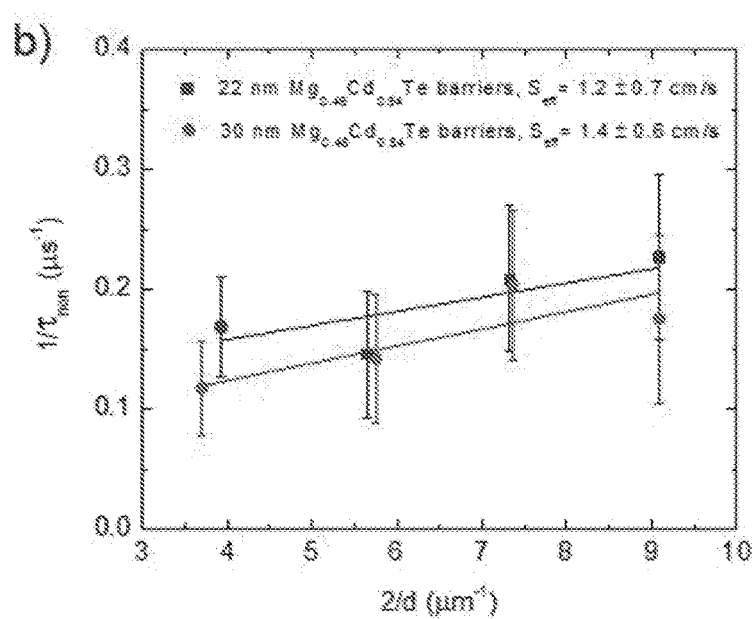
FIG. 33 contains plots of inverse non-radiative recombination lifetime 1/$\tau_{nr}$ versus inverse CdTe layer thickness 2/d. The effective interface recombination velocities have been extracted through the fittings of these data points. The error bars of 1/$\tau_{non}$ are determined by considering the uncertainty of the estimated radiative lifetimes.
Figure 34:
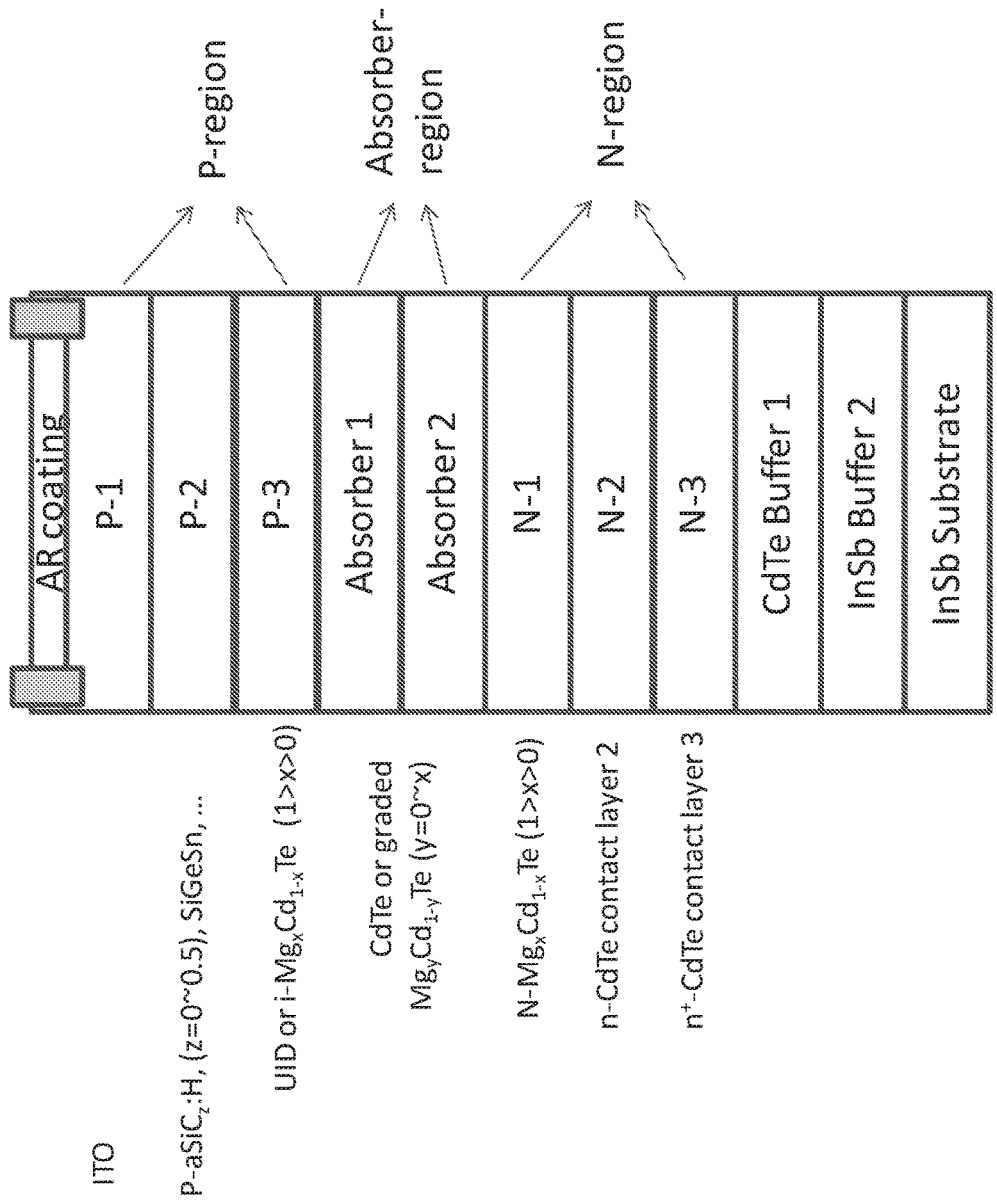
FIG. 34 shows an alternative schematic of a layered structure for a solar cell and/or photodetector on an InSb substrate.
Figure 35:
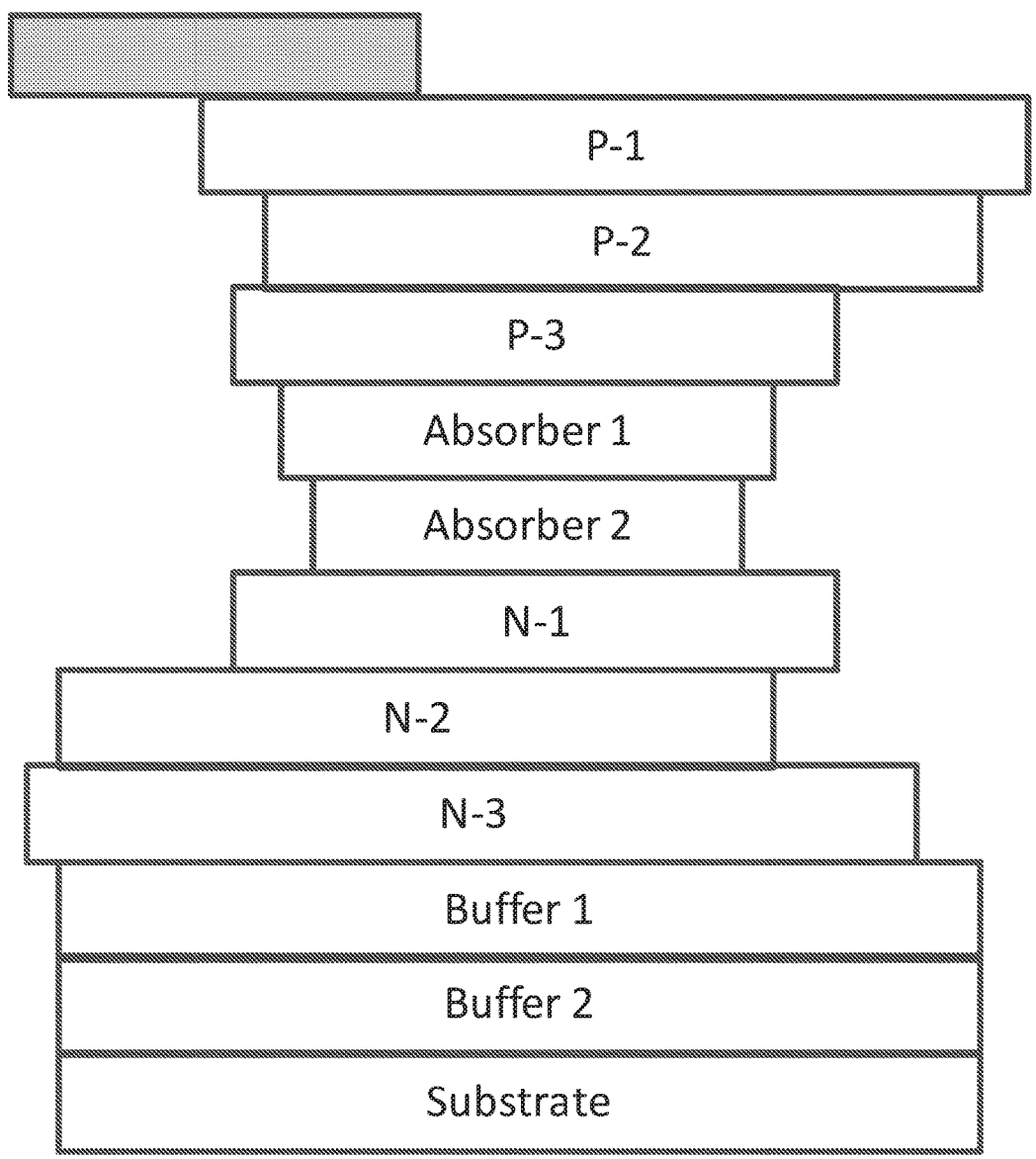
FIG. 35 shows a schematic of the band edge alignment for layers of the structure of FIG. 28.
Figure 36:
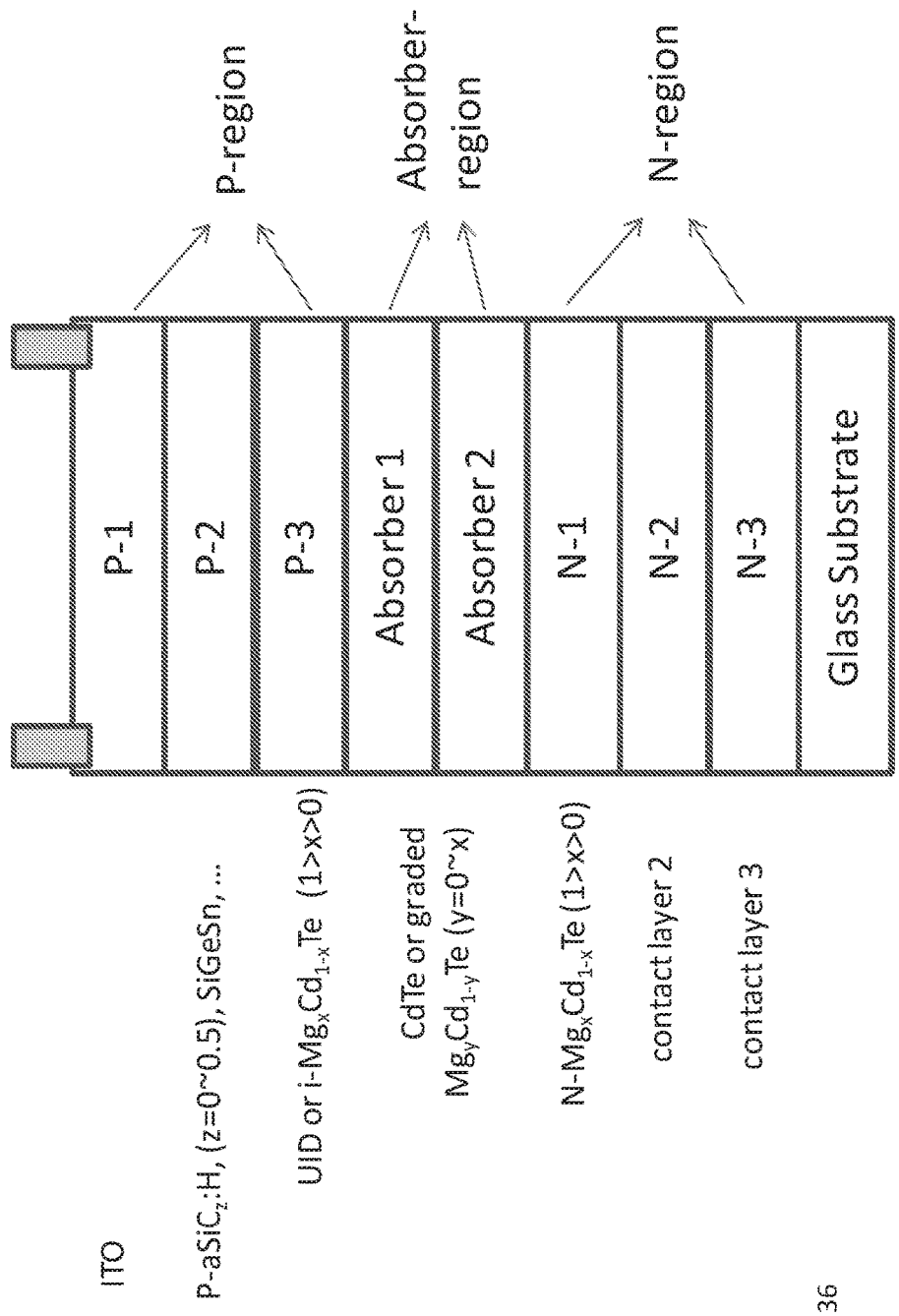
FIG. 36 shows the schematic of a layered structure of an embodiment of the (n-on-p) solar cell and/or photodetector on a glass substrate.
Figure 37:
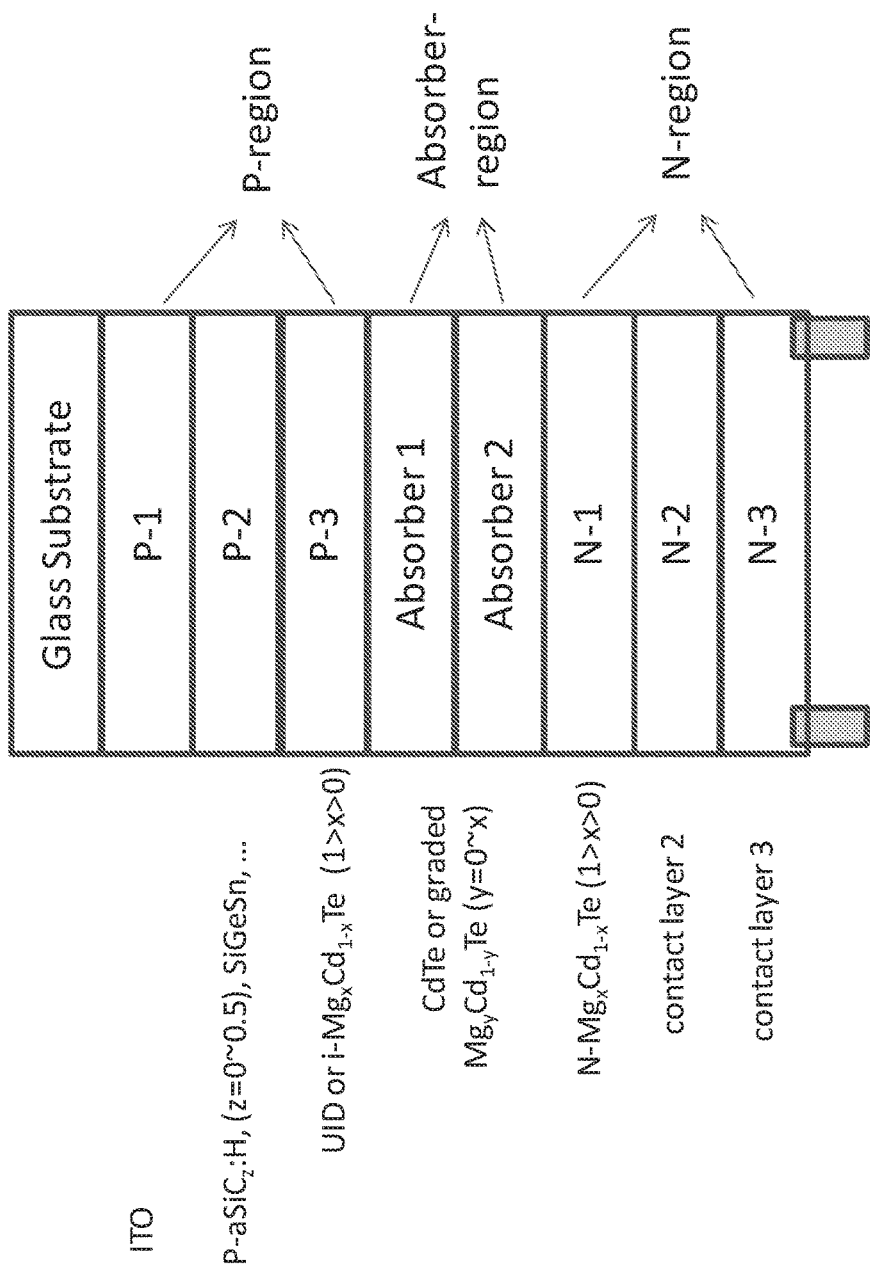
FIG. 37 shows the schematic of a layered structure of an embodiment of the (p-on-n) solar cell and photodetector substrate on glass substrate.

Since radiative lifetime is dependent on the sample thickness, only the non-radiative lifetimes were used to extrapolate the effective IRV, which was calculated from the measured effective lifetime and an estimated radiative lifetime. FIG. 33 provides plots of inverse non-radiative lifetime ($1/\tau_{nr}$) versus inverse CdTe layer thickness ($2'd$) for the four samples shown in FIG. 32, which have 30-nm-thick $Mg_{0.46}Cd_{0.54}Te$ barriers, and another set of four samples with identical layer structure and alloy composition but 22-nm-thick barriers. Weighted fittings of the data using the error bars yield effective IRVs of 1.2±0.7 cm/s and 1.4±0.6 cm/s, which are comparable to or better than the best values reported for $GaAs/Al_{0.5}Ga_{0.5}As$ (18 cm/s), $GaAs/Ga_{0.5}In_{0.5}P$ (1.5 cm/s).

Based on the empirical evidence and discussions presented above, it would be appreciated by a person of skill in the art that the record minority carrier lifetime (3.6 μs), limited partially by radiative recombination, and interface recombination velocity (as low as 1.2 cm/s) achieved in the $CdTe/Mg_xCd_{1-x}Te$ double heterostructures are comparable to or even better than the best values reported for $GaAs/Al_{0.5}Ga_{0.5}As$ (18 cm/s), $GaAs/Ga_{0.5}In_{0.5}P$ (1.5 cm/s) double heterostructures and thus indicative of the potential for high $V_{oc}$ solar cell devices. The innovative approach for p-contact using a heavily-doped a-Si:H or a-SiC$_y$:H p-contact layer in conjunction with the double-heterostructure design, namely a $Mg_xCd_{1-x}Te$ front passivation/barrier layer, allows the large implied $V_{oc}$ values resulted from the long carrier lifetime and low interface recombination velocity to be realized in functioning devices. $Mg_xCd_{1-x}Te/CdTe/Mg_{0.24}Cd_{0.76}Te$ double heterostructure solar cells with the novel p-contact layers (Design A) demonstrated $V_{oc}$ consistently over 1 V substantially without sacrificing the output power under operating conditions and a maximum measured efficiency of 14.66%±1.4% with a $V_{oc}$ of 0.9954 V±0.3% certified by NREL. The maximum certified V. of a device with similar layer structure design (Design B) is 1.0542 V±0.5%. Additional measurements of more devices with calibrated setups in the authors' laboratories reveal that the best tested device (design B) has a $V_{oc}$ of 1.036 V, a $J_{sc}$ of 22.3 mA/cm$^2$, a fill-factor of 73.6%, and a power conversion efficiency of 17.0%. The maximum $V_{oc}$ measured from these devices is 1.096 V, which is quickly approaching the theoretical limit of 1.17 V. All these device characteristics are substantially greater than the previous records of $V_{oc}$ (0.892 V) and efficiency (13.4%). It is worth noting that the use of double heterostructure enables a much broader choice of contact-layer materials with various degrees of perfection (crystalline or amorphous) for both types, p-type in particular for CdTe case, and maintains the high performance of the solar cell without being compromised, as the minority carriers in the CdTe absorber will be confined by the barriers. Therefore, the combination of the double heterostructure design and the amorphous p-contact layer offers an alternative way to circumvent the major challenge of p-type doping and opens the door to many novel devise structure designs, such the use ZnTe, MoO$_x$, and CuZnS for the p-contact layers.

FIGS. 34, 35, 36, and 37 illustrate schematically light-conversion devices structured according to related embodiment of the invention.

The following implementations and uses of the idea(s) of the invention are intended to be within the scope of the invention:

A) The use of InSb substrate for growth of CdTe-based layer(s) and formation of the solar cell devices;

B) The use of Mg$_x$Cd$_{1-x}$Te (x=0~0.9) barrier layers (including graded barriers) for CdTe/MgCdTe-based DHs:

C) The use of p-ZnTe doping for p-ZnTe/(i- or p-) Mg$_x$Cd$_{1-x}$Te/n-CdTe/N—Mg$_x$Cd$_{1-x}$Te)

D) The use of p-aSi:H for p-region (a low-cost process);

E) The use of p-aSiC$_{z:H}$ (z=-0 . . . 0.5) for p-region;

F) A bifacial CdTe heterostructure solar cell structured according to an embodiment of the invention;

G) Material base for the p-doped region broadened due to the use DH structure of the invention: 1) P—SiCGeSn/MgCdTe/CdTe (optimize both Eg and lattice Constant.) 2) P—ZnO/MgCdTe/CdTe; 3) P—AlN, GaN, InGaAlN/MgCdTe/CdTe; 4) P-graphene/MgCdTe/CdTe; 5) P-diamond thin film/MgCdTe/CdTe/MgCdTe; and H) The use p-CuZnS/MgCdTe/CdTe cell structure. The p-CuZnS is from LBL For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably". "by and large". "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

A person of skill in the art will readily appreciate, therefore, that the present disclosure describes a methodology of forming a novel type of devices configured to convert light to electricity (be it a photovoltaic cell or an optical detector. Among such devices there are:

(i) The device including an InSb substrate, and a double-heterojunction (DH) structure carried on said InSb substrate, where the DH structure contains a CdTe-containing absorber layer sandwiched between first and second Mg$_x$Cd$_{1-x}$Te-containing barrier layers, and where the first and second barrier layers are configured to confine minority carriers to the absorber layer. Such DH structure is characterized by an open-circuit voltage that exceeds 1 V.

The device may additionally contain an electrode layer and a p-typed doped contact layer configured between the electrode layer and the DH structure (in a specific case, the p-type doped contact layer is a p-aSiC$_y$:H contact layer, with a value of y being between and inclusive of zero and 0.5).

The DH structure of the device is characterized by effective radiative carrier lifetime that exceeds 2 microseconds, preferably exceeds 3 microseconds, and more preferably exceeds 3.5 microseconds. In one implementation, an absolute value of interface recombination velocity (IRV) of carriers in such DH structure is lower than a first IRV of carriers characterizing a first material interface and lower than a second IRV of carriers characterizing a second material interface (the first material interface including a GaAs/Al$_{0.5}$Ga$_{0.5}$As material interface and the second material interface including a GaA/Ga$_{0.5}$In$_{0.5}$P material interface). An absolute value of IRV of carriers in said DH structure is lower than 1.5 m/s in a specific case, and in a related embodiment the DH structure includes p-type ZnTe doping material. The device may include a layer of a-Si:H on the DH structure, the a-Si:H layer configured as a p-type doped electrical contact layer. If this is the case, a barrier layer from the first and second barrier layers contains a spatial doping material profile that is not uniform across the thickness of the barrier layer.

(ii) The device including an InSb substrate and a double-heterojunction structure carried on said InSb substrate, which DH structure contains a CdTe-containing absorber layer sandwiched between first and second Mg$_x$Cd$_{1-x}$Te-containing barrier layers, where the first and second barrier layers are configured to confine minority carriers to the absorber layer, and where a pn-junction is formed outside of the absorber layer. In specific implementations, additional and/or alternative features present in such device are similar to those itemized for the device mentioned immediately above.

Employed Methodologies.

MBE Material Growth.

All samples discussed in this article were grown on InSb (001) substrates using a dual-chamber VG V80H MBE system. InSb substrates are first prepared with an oxide removal process within the III-V growth chamber. The substrates are heated to 500° C. at a rate of 25° C./min as measured by a thermocouple calibrated by a pyrometer at higher temperatures. At 350° C. the Sb cell shutter is opened to suppress any Sb desorption. At this point the substrate temperature is further increased at a rate of 5° C./min with 3 minute holding periods between each ramp until the pyrometer reads a substrate temperature of 475 OC. Slow, deliberate temperature control is necessary to ensure that the substrate does not surpass its melting point which is very close to the oxide removal temperature. This temperature is held for a period of one hour until streaky pseudo-(1×3) Reflection High-Energy Electron Diffraction (RHEED) reconstruction patterns are observed, indicating the removal of the surface oxide. After the surface oxide has been removed, the substrate temperature is brought down to a pyrometer reading of 390° C. for the n-type InSb:Te buffer growth—the cells are controlled so as to give a Sb/In flux ration of 1.5 and a growth rate of 10.8 nm/min. Tellurium cell temperature is used to dope the InSb buffer layer to $5 \times 10^{17}$ electrons. The samples are then transferred through the ultra-high vacuum prep chamber to the II-VI growth chamber avoiding surface oxidation. During the substrate temperature ramp before the II-VI material growth, the samples are exposed to a Cd flux for several minutes to prevent the formation of a group III-VI alloy on the surface. An n-type CdTe:In buffer layer is then grown at the substrate at 280° C. (pyrometer reading) with an initial Cd/Te flux ratio of 3.0 in order to further prevent the formation of $In_3Te_2$ at the InSb/CdTe interface. The indium doping cell temperature is set to dope the CdTe buffer layer to $5 \times 10^{17}$ $cm^{-3}$. After two minutes of growth however, the Cd/Te flux ratio is adjusted to an optimum 1.5. The surface quality is monitored through RHEED imaging and upon seeing streaky RHEED patterns after approximately 10 min, the surface is ready for device growth. It is important to note that the substrate temperature reading will decrease to approximately 265° C. during the buffer growth as the emissivity of the wafer surface changes. All additional II-VI layers were grown at the same substrate temperature of 265° C. and the same 1.5 Cd:Te flux ratio. Magnesium incorporation and indium doping concentration are controlled with varying the cell temperatures. Magnesium alloying has a negligible effect on growth rate and thus all nominal thicknesses are calculated from a 1.6 A/sec growth rate. The $Mg_{0.24}Cd_{0.76}Te$ back-side barrier is grown with a Mg:Te flux ratio of 0.39. The intrinsic $Mg_xCd_{1-x}Te$ layer has a magnesium incorporation range of 0.30 to 0.46 throughout the experiments grown using a Mg:Te flux ratio of 0.5 to 0.84.

XRD Measurements.

High-resolution X-ray diffraction (XRD) measurements were carried out using a PANalytical X'Pert PRO MRD diffractometer. The incident beam is first focused through a hybrid monochromator module while the diffracted beam is collected through a triple-axis detector. The measurements used a step size of 0.001 degrees with a time step of 0.5 seconds. Detailed computer simulations of the XRD patterns were used to accurately determine the layer thickness of all those barrier layers in the PL samples.

Steady, State Photoluminescence (PL) Measurements.

General material quality was characterized using the photoluminescence (PL) collection system which consists of a spectrometer with a 0.85 m focal length, a photomultiplier tube (PMT), and a germanium detector—for CdTe samples, a PMT is used. A 532 nm diode pumped solid state (DPSS) 40 mW laser is used as the excitation source and the incident power is adjusted to 0.92 mW using a neutral density filter; the beam radius on the sample is measured to be 0.54 mm. This corresponds to a power density of 100 mW/cm², similar to one sun power density. A chopper is used to modulate the laser beam and send a reference signal to a lock-in amplifier, which improves signal-to-noise ratio.

Time-Resolved Photoluminescence (IRPL) Measurements.

Carrier lifetimes and interface recombination velocities were determined using time-resolved photoluminescence (TRPL) measurements with a time-correlated single-photon-counting (TCSPC) system. A Becker-Hickl SPC-830 single-photon-counting card is used for data acquisition. The excitation sources are an ultrafast titanium-sapphire laser and a Fianium fiber laser, which emit wavelengths in the range of 700 nm to 950 nm and 450 nm to 750 nm, respectively. The repetition rate of the Ti:Sapphire laser (0.4 MHz 80 MHz) and the Fianium laser (0.1 MHz 20 MHz) can be adjusted accordingly. A spectrometer is used to collect the PL from the sample at a specific wavelength and a high speed PMT detector is used to detect the photons in the wavelength range from 300 nm to 900 nm. The detection wavelength is set to 820 nm, which is the PL peak position of CdTe at room temperature.

Device Processing and Characterization.

The p-doped amorphous silicon layer was deposited after air exposure, without prior surface treatment, by plasma-enhanced chemical vapor deposition (PECVD) in a P-5000 tool using silane, hydrogen, and tri-methyl boron, at a pressure of 2.5 Torr, a nominal susceptor temperature of 250° C. and radio-frequency (RF) power of 36 W. Deposition time was adjusted to obtain a 12-nm-thick layer. A 73-nm-thick layer of tin-doped indium oxide (ITO, 95%/5%) was then sputtered in an MRC sputtering tool with direct current (DC) sputtering, at room temperature, a pressure of 2.5 mTorr and a power of 1 kW, yielding a film with <100 Ω/sq. sheet resistance. More details on these processes can be found on http://hdl.handle.net/2286/R.I.20907. A laser-cut shadow-mask was used during ITO sputtering to define circular pads of 2-mm diameter to 3-mm diameter. To ensure a good electrical contact from the back of the device to the measurement chuck during electrical characterization, a 100-nm-thick layer of silver was sputtered on the back of the devices with DC sputtering at 1 kW without prior treatment of the surface.

Light J-V Measurements.

Solar cell parameters such as the open-circuit voltage, fill factor and power conversion efficiency were extracted from Light I-V measurements taken using an Oriel Class A Solar Simulator. The Newport Class A solar simulator generates a 4 inch diameter collimated beam using a Xenon arc lamp and a series of filters designed to provide 0.1 W/cm² at the surface of the testing stage. Electrical contact is made using a 2-point probe controlled by a Keithley 2400 multimeter. The incident beam intensity is set using a calibrated Oriel Silicon detector. No spectral mismatch factor was used and the efficiency measurement of the same cell measured at ASU and NREL were 14.57% and 14.66%, respectively. However, in order to more accurately represent the output current of the device, the integrated response of the EQE weighted against the standard reference spectrum was used to determine the short-circuit current density. The reported J-V curves have been corrected in order to fit the $J_{sc}$ as measured by the EQE. The scans were completed in the forward direction with a 10 mV step and a dwell time of approximately 20 ms at each step. A mask/aperture was used during all Light I-V measurements. The aperture was necessary as the cell areas were not perfectly defined using mesas. The $J_{sc}$ was seen to vary with device size as specified by the aperture. Hysteresis was not checked for at ASU, yet NREL did perform a hysteresis check and reported a 4% variation in FF and $P_{max}$.

External Quantum Efficiency (EQE) Measurements.

Quantum efficiency is a wavelength-dependent collection efficiency that helps analyze how different areas of the device effect current generation. The EQE is measured under short-circuit conditions using an Oriel QEPVSI quantum efficiency measurement system. This system is composed of a Xenon arc lamp, a chopper set to generate 100 Hz square waves, a monochromator, and a series of focusing optics to create a 2 mm×2 mm square beam incident on the surface of the device under test. The device's output current is fed into a transimpedance amplifier whose output voltage is sent to a lock-in amplifier. The signal is then referenced to a calibrated silicon detector head which is under the same light bias via a beam splitter.

C-V Measurements

Capacitance-voltage (C-V) measurements are conducted after the deposition of p-type a-Si:H on the CdTe/MgCdTe DHs, using a mercury probe with a contact area of 4.56× $10^{-5}$ m$^2$, and a Hewlett Packard 4284A Precision LCR meter. The built-in voltage is determined by plotting $1/C^2$ vs. V, and extrapolating the curve to the x-axis. The intersection on the x-axis gives the extrapolated built-in voltage.

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole, including features disclosed in prior art to which reference is made.

The present invention has been described in terms of one or more preferred embodiments, and it should be appreciated that many equivalents, alternatives, variations, and modifications, aside from those expressly stated, are possible and within the scope of the invention.

What is claimed is:

1. A device configured to convert light to electricity, the device comprising:
   an InSb substrate, and
   a double-heterojunction (DH) structure carried on said InSb substrate, said DH structure including a CdTe-containing absorber layer sandwiched between first and second $Mg_xCd_{1-x}Te$-containing barrier layers,
   wherein the first and second barrier layers are configured to confine minority carriers to said absorber layer, and
   wherein said DH structure is characterized by an open-circuit voltage that exceeds 1 V,
   and further comprising a layer of a-Si:H on the DH structure, said a-Si:H layer configured as a p-type doped electrical contact layer, and
   wherein a barrier layer from the first and second barrier layers contains a spatial doping material profile that is not uniform across the thickness of said barrier layer.

2. The device according to claim 1, further comprising an electrode layer and a p-typed doped contact layer configured between said electrode layer and said DH structure.

3. The device according to claim 1, wherein said p-type doped contact layer is a p-aSi$C_y$:H contact layer, wherein a value of y is within a range between zero and 0.5, inclusive of zero.

4. The device according to claim 1, characterized by an effective radiative lifetime of carriers, in said DH structure, that exceeds 2 microseconds.

5. The device according to claim 1, characterized by an effective radiative lifetime of carriers, in said DH structure, that exceeds 3 microseconds.

6. The device according to claim 1, wherein an absolute value of interface recombination velocity (IRV) of carriers in said DH structure is lower than a first IRV of carriers characterizing a first material interface and lower than a second IRV of carriers characterizing a second material interface, the first material interface including a GaAs/$Al_{0.5}Ga_{0.5}As$ material interface and the second material interface including a GaA/$Ga_{0.5}In_{0.5}P$ material interface.

7. The device according to claim 1, wherein an absolute value of IRV of carriers in said DH structure is lower than 1.5 m/s.

8. The device according to claim 1, wherein said DH structure includes a p-type ZnTe doping material.

9. The device according to claim 1, further comprising a p-type doped contact layer on said DH structure, said p-type contact layer containing a layer of aSi$C_y$:H and an immediately neighboring aSi:H layer,
   wherein y is about 6%,
   wherein the first barrier layer is a 10 nm thick undoped $Mg_{0.30}Cd_{0.70}Te$ barrier layer, the first barrier layer being the closest of the first and second barrier layers to the p-type doped contact layer,
   wherein the absorber layer has an approximately 1 micron thickness and is doped with n-type In doping at a level of about $3e^{16}$ cm$^{-3}$.

10. The device according to claim 1, further comprising a p-type doped contact layer on said DH structure, said p-type contact layer including a layer of aSi:H,
    wherein the first barrier layer is a 10 nm thick undoped $Mg_{0.30}Cd_{0.70}Te$ barrier layer, the first barrier layer being the closest, of the first and second barrier layers, to the p-type doped contact layer, and
    wherein the absorber layer has an approximately 1.4 micron thickness and is doped with n-type In at a first level of about $1e^{16}$ $cm^{-3}$ in a first portion of said absorber layer and at a second level of about $5e^{17}$ $cm^{-3}$ in a second portion of said absorber, the first portion being about 1 micron thick, the second portion being spatially complementary to said first portion.

11. The PV cell according to claim 10, wherein the second portion of the absorber layer is separated from said contact layer by the first portion of said absorber layer.

12. A device configured to convert light to electricity, the device comprising:
    an InSb substrate, and
    a double-heterojunction (DH) structure carried on said InSb substrate, said DH structure including a CdTe-containing absorber layer sandwiched between first and second $Mg_xCd_{1-x}Te$-containing barrier layers,
    wherein the first and second barrier layers are configured to confine minority carriers to said absorber layer, and
    wherein a pn-junction is formed outside of the absorber layer,
    and further comprising a layer of a-Si:H on the DH structure, said a-Si:H layer
    configured as a p-type doped electrical contact layer, and
    wherein a barrier layer from the first and second barrier layers contains a spatial doping material profile that is not uniform across the thickness of said barrier layer.

13. A device according to claim 12, wherein said DH structure is characterized by an open-circuit voltage that exceeds 1 V.

14. A device according to claim 12, wherein said p-type doped contact layer is a p-aSiC$_y$:H contact layer, wherein a value of y is within a range between and inclusive of zero and 0.5.

15. The device according to claim 12, characterized by an effective radiative lifetime of carriers, in said DH structure, that exceeds 2 microseconds.

16. The device according to claim 12, wherein an absolute value of interface recombination velocity (IRV) of carriers in said DH structure is lower than a first IRV of carriers characterizing a first material interface and lower than a second IRV of carriers characterizing a second material interface, the first material interface including a GaAs/$Al_{0.5}Ga_{0.5}As$ material interface and the second material interface including a GaA/$Ga_{0.5}In_{0.5}P$ material interface.

17. The device according to claim 12, wherein at least one of the following conditions is satisfied: (i) an absolute value of IRV of carriers in said DH structure is lower than 1.5 m/s and (ii) wherein said DH structure includes a p-type ZnTe doping material.

18. The device according to claim 12, further comprising a p-type doped contact layer on said DH structure, said p-type contact layer containing a layer of aSiC$_y$:H and an immediately neighboring aSi:H layer,
    wherein y is about 6%,
    wherein the first barrier layer is a 10 nm thick undoped $Mg_{0.30}Cd_{0.70}Te$ barrier layer, the first barrier layer being the closest of the first and second barrier layers to the p-type doped contact layer,
    wherein the absorber layer has an approximately 1 micron thickness and is doped with n-type In doping at a level of about $3e^{16}$ $cm^{-3}$.

19. The device according to claim 12, further comprising a p-type doped contact layer on said DH structure, said p-type contact layer including a layer of aSi:H,
    wherein the first barrier layer is a 10 nm thick undoped $Mg_{0.30}Cd_{0.70}Te$ barrier layer, the first barrier layer being the closest, of the first and second barrier layers, to the p-type doped contact layer, and
    wherein the absorber layer has an approximately 1.4 micron thickness and is doped with n-type In at a first level of about $1e^{16}$ $cm^{-3}$ in a first portion of said absorber layer and at a second level of about $5e^{17}$ $cm^{-3}$ in a second portion of said absorber, the first portion being about 1 micron thick, the second portion being spatially complementary to said first portion.

20. The PV cell according to claim 19, wherein the second portion of the absorber layer is separated from said contact layer by the first portion of said absorber layer.

* * * * *